(12) United States Patent
Shetty et al.

(10) Patent No.: US 9,591,606 B1
(45) Date of Patent: Mar. 7, 2017

(54) RACK LOCATION DETERMINATION SYSTEM

(71) Applicant: Dell Products L.P., Round Rock, TX (US)

(72) Inventors: Sudhir Vittal Shetty, Cedar Park, TX (US); Jeffrey Lairsey, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 14/869,123

(22) Filed: Sep. 29, 2015

(51) Int. Cl.
*H04W 64/00* (2009.01)
*H04W 4/04* (2009.01)
*G01S 5/02* (2010.01)

(52) U.S. Cl.
CPC ........... *H04W 64/00* (2013.01); *G01S 5/0284* (2013.01); *H04W 4/04* (2013.01)

(58) Field of Classification Search
CPC .... G08B 21/24; G08B 25/10; G08B 13/2462; G08B 21/0227; G08B 21/0269; G08B 21/0277; G08B 21/182; G08B 3/1083; G08B 5/36
USPC ........................................................ 340/8.1
See application file for complete search history.

(56) References Cited

U.S. PATENT DOCUMENTS

| 2008/0272887 | A1* | 11/2008 | Brey | ....................... H04L 12/24 340/10.1 |
| 2012/0005344 | A1* | 1/2012 | Kolin | ................. H05K 7/20836 709/226 |
| 2016/0275351 | A1* | 9/2016 | Cattoen | ................ G06K 9/6202 |
| 2016/0282823 | A1* | 9/2016 | Wang | ..................... G06Q 50/06 |

OTHER PUBLICATIONS

Robert Barrett and Saurav Shrestha, "Server Information Handling System Wireless Management and Topology," Filed Jun. 30, 2015; 30 Pages, U.S. Appl. No. 14/755,284.

* cited by examiner

*Primary Examiner* — Mark Blouin
(74) *Attorney, Agent, or Firm* — Haynes and Boone, LLP

(57) ABSTRACT

A rack location determination system includes a rack that defines a plurality of device housings. A rack wireless communication device is positioned on the rack and a computing device that includes a computing device wireless communication subsystem and that is positioned in a first device housing of the plurality of device housings in the rack. The computing device is configured to receive a wireless signal through the computing device wireless communication subsystem from the rack wireless communication device and determine a wireless signal strength of the received wireless signal. Based on the wireless signal strength of the wireless signal, the computing device is configured to determine a rack location of the computing device by using the wireless signal strength with a wireless signal strength/rack location mapping. The wireless signal strength/rack location mapping is associated with a location of the first rack wireless communication device.

20 Claims, 16 Drawing Sheets

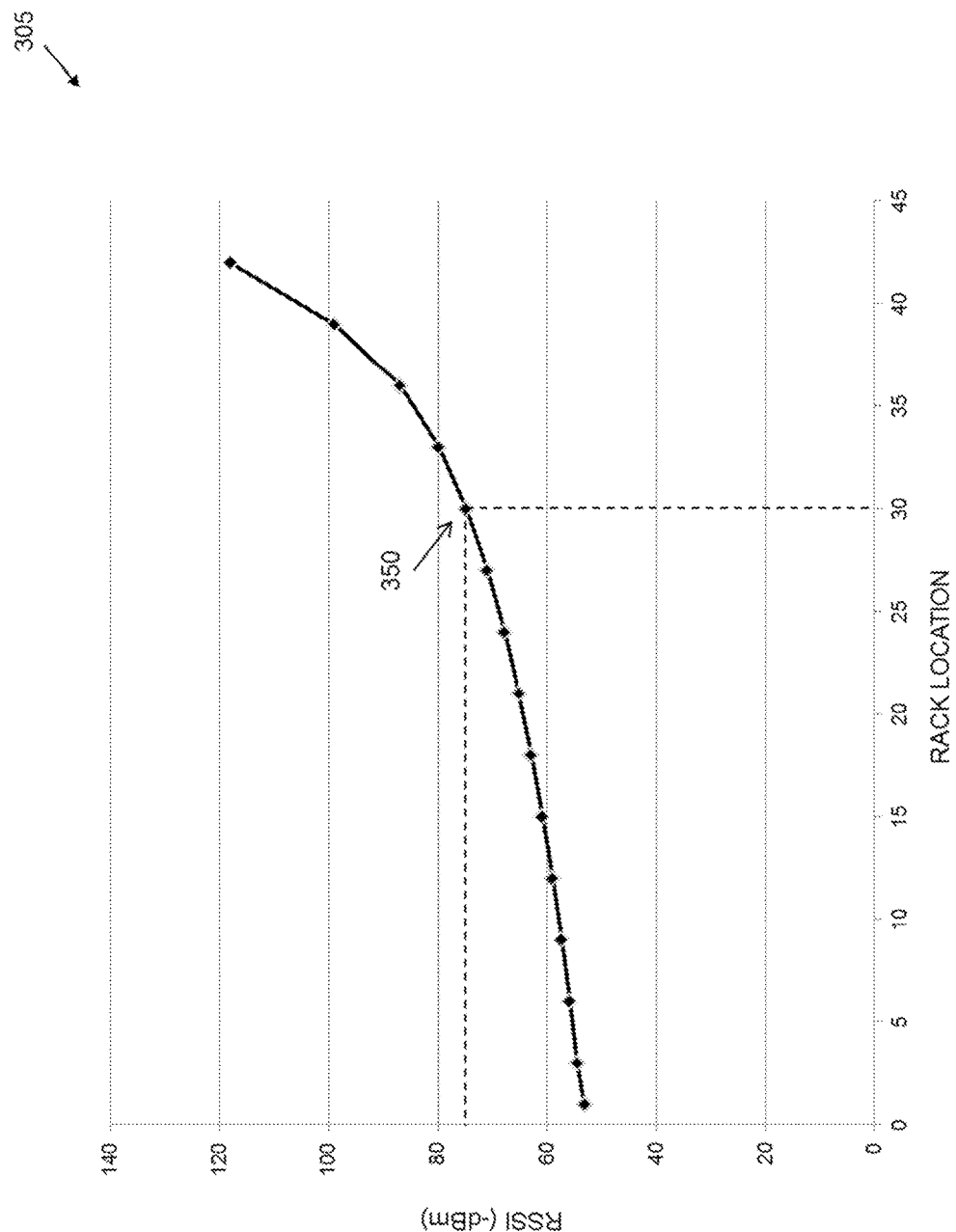

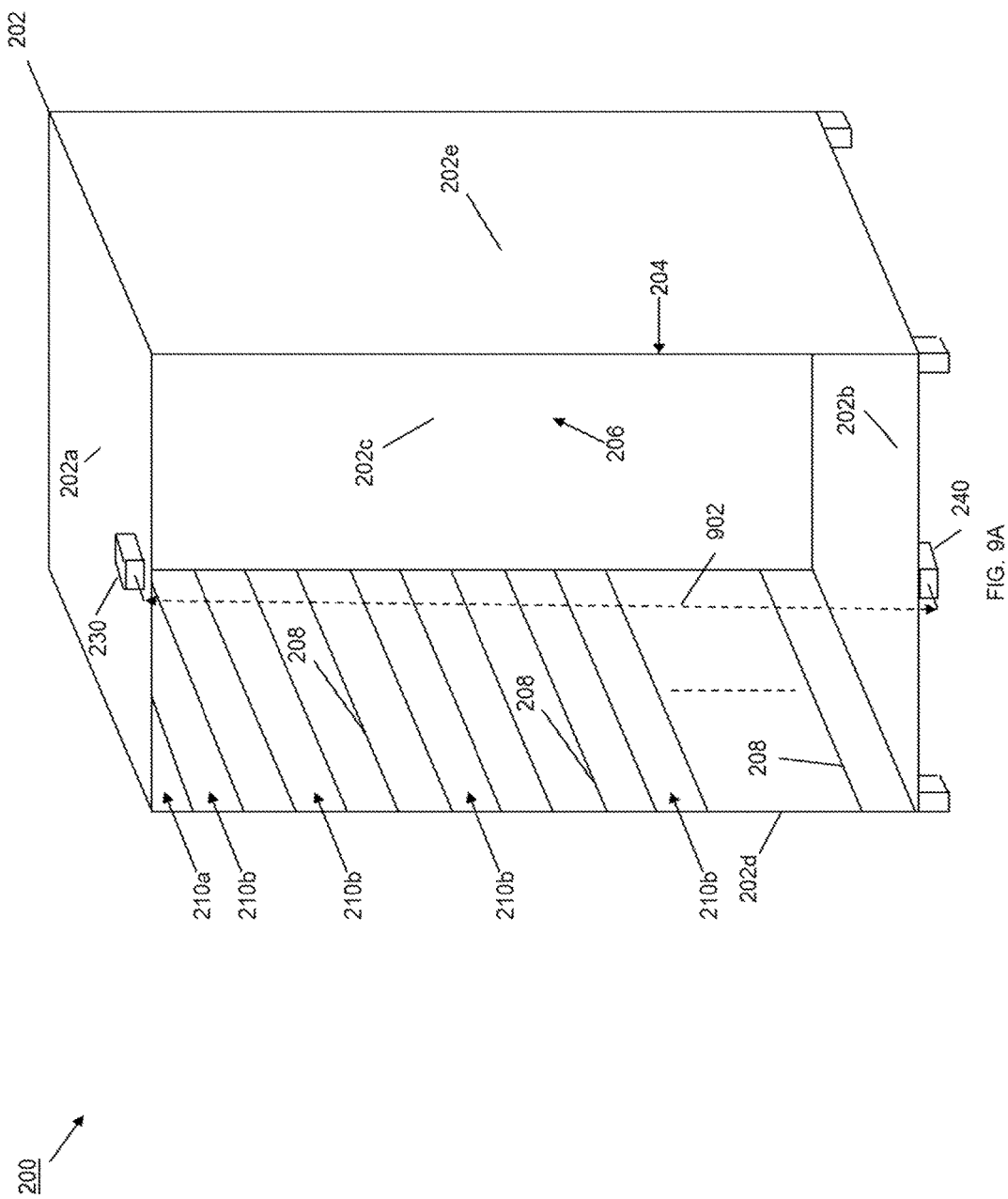

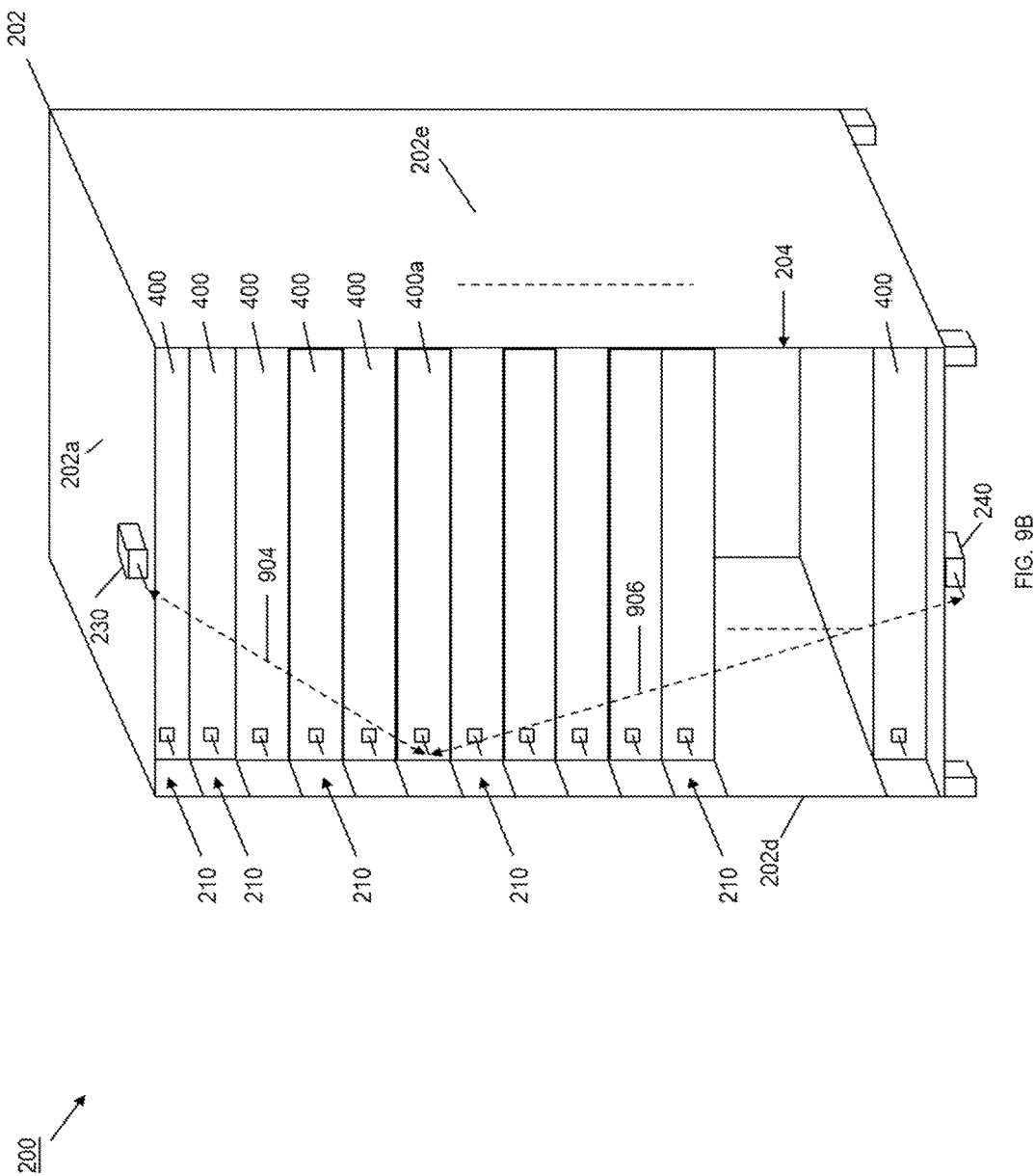

RACK LOCATION DETERMINATION SYSTEM

The present disclosure relates generally to information handling systems, and more particularly to determining a rack location of an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, switches, servers, storage devices, and/or other rack devices known in the art, are sometimes provided in datacenters that may include one or more buildings that house those datacenters. A datacenter may include a plurality of racks (sometimes in the thousands), and each rack may house a plurality of rack devices (e.g., over 40 standard sized servers and/or other devices used to provide at least a portion of the datacenter). Thus, locating, identifying, and ensuring that rack devices in a rack or datacenter are secured can be difficult. Conventionally, in order to locate a server in a datacenter, a number of approaches have been used. For example, a datacenter administrator may be required to periodically visit each rack and record the location of the rack and its servers in a spreadsheet or other database. In other examples, identification tags and sensors (e.g., RFID tags and sensors) may be provided on the servers and in server housings in the rack in order to detect the identity and location of the server in the rack (i.e., via an RFID sensor attached to the rack reading an RFID tag attached to the server when the server is positioned in the rack), or mobile tracking software and hardware (e.g., a tracking application and location determination hardware) may be used to report the location and identity of each of the servers in a datacenter. Such solutions can require a relatively large amount of time and effort for a datacenter administrator and/or may introduce a relatively large cost associated with the additional subsystems needed to enable the location determination for the servers.

Accordingly, it would be desirable to provide an improved rack location determination system.

SUMMARY

According to one embodiment, an information handling system (IHS) includes a chassis that is configured to couple to a first device housing of a rack that defines a plurality of device housings; a chassis wireless communication system that is housed in the chassis; a processing system that is housed in the chassis and coupled to the chassis wireless communication system; and a memory system that is housed in the chassis, coupled to the processing system, and that includes instruction that, when executed by the processing system, cause the processing system to provide a rack location determination engine that is configured to: receive a first wireless signal through the chassis wireless communication system from a first rack wireless communication device that is positioned on the rack; determine a first wireless signal strength of the first wireless signal; and determine a first rack location of the chassis by using the first wireless signal strength with a first wireless signal strength/rack location mapping that is associated with a location of the first rack wireless communication device.

BRIEF DESCRIPTION OF THE DRAWINGS

FIG. 3C is a graph illustrating an embodiment of a second wireless signal strength/rack location mapping that may be stored in the rack wireless communication of FIG. 3A.

FIG. 9A is a perspective view illustrating an embodiment of communication between the rack wireless communication devices on the rack of FIG. 2.

FIG. 9B is a perspective view illustrating an embodiment of communication between one of a plurality of the server devices of FIGS. 4A and 4B and the rack wireless communication devices in the rack of FIG. 2.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
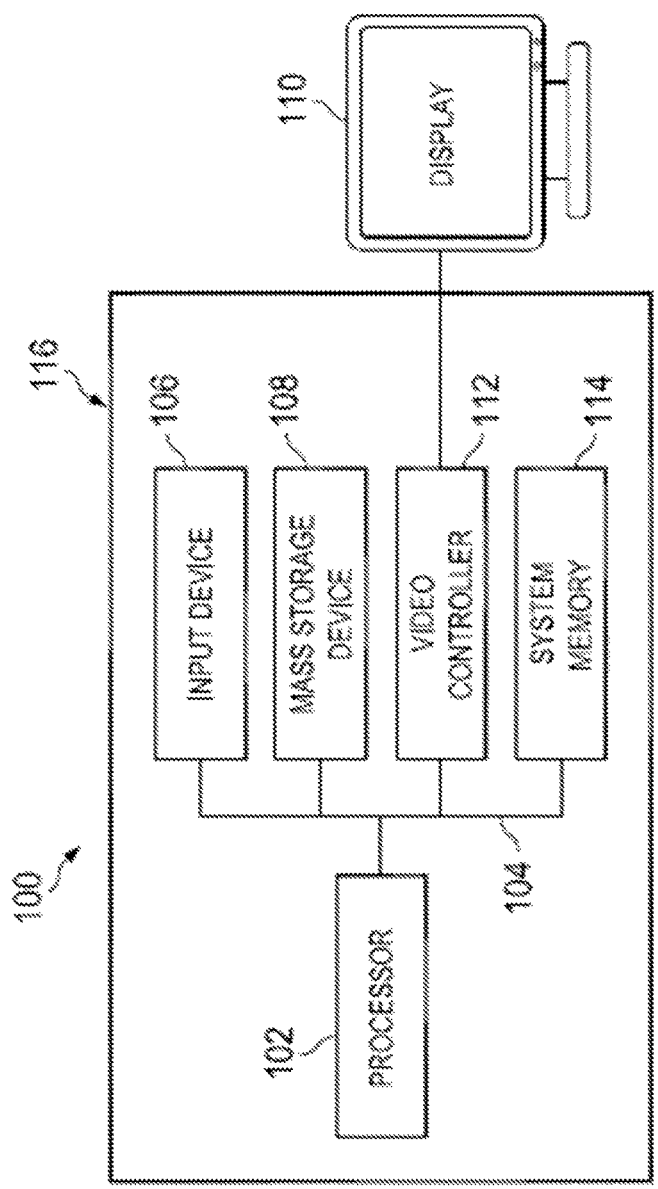
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
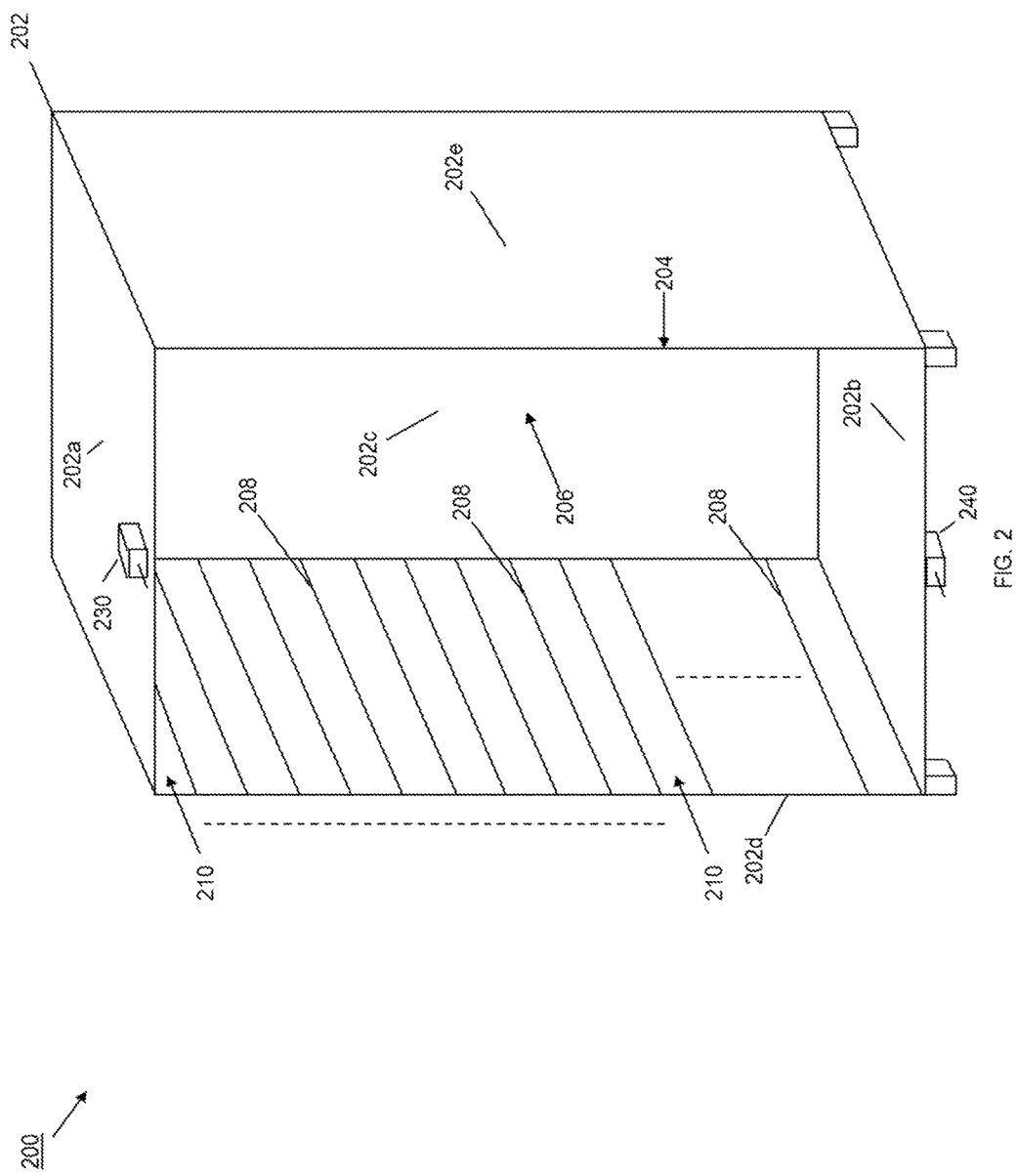
FIG. 2 is a perspective view illustrating an embodiment of a rack.

Referring now to FIG. 2, an embodiment of a rack 200 is illustrated. The rack 200 is illustrated and described below as a conventional datacenter rack that houses a plurality of server devices in a vertical (e.g., one-on-top-of-the-other) orientation. However, one of skill in the art in possession of the present disclosure will recognize that the teachings of the present disclosure may be applied to different types of racks used in different situations (e.g., other than datacenters) and that house other types of devices (e.g., switches, storage devices, and/or other rack devices known in the art) in any of a variety of orientations (e.g., a horizontal/side-by-side orientation). The rack 200 includes a rack base 202 having a top wall 202a, a bottom wall 202b that is located opposite the rack base 202 from the top wall 202a, a rear wall 202c that extends between the top wall 202a and the bottom wall 202b, and a pair of side walls 202d and 202e that are located on opposite sides of the rack base 202 and that extend between the top wall 202a, the bottom wall 202b, and the rear wall 202c. While illustrated and described as "walls" for clarity, one of skill in the art in possession of the present disclosure will recognize that any or all of the top wall 202a, the bottom wall 202b, the rear wall 202c, and the side walls 202d and 202e may instead include framing, define channels, holes, or other apertures, and/or may otherwise include different structures that provide the rack 200 while remaining within the scope of the present disclosure. The edges of the top wall 202a, the bottom wall 202b, and the side walls 202d and 202e that are opposite the rear wall 202c define a rack entrance 204 that provides access to a rack housing 206 that is defined between the top wall 202a, the bottom wall 202b, the rear wall 202c, and the side walls 202d and 202e. In the embodiment of FIG. 2, the rack entrance 204 is illustrated as open and allowing access to the rack housing 206. However, in other embodiments, the rack 200 may include a door that is configured to close over the rack entrance 204 and control access to the rack housing 206 (e.g., in a cooled rack). As such, in some embodiments the rack entrance 204 may provide a design limit with regard to devices positioned in the rack housing 206 (e.g., such that they may not extend past the rack housing 204), while in other embodiments, the rack entrance 204 may not introduce such design limits (or at least allow for the extension of devices past the rack housing 204).

Still referring to FIG. 2, the rack 200 includes a first rack wireless communication device 230 that is centrally located on the top wall 202a adjacent the rack entrance 204, and a second rack wireless communication device 240 that is centrally located on the bottom wall 202b adjacent the rack entrance 204. Although the first rack wireless communication device 230 and the second rack wireless communication device 240 are each illustrated and described as located in a central-and-front position (i.e., midway between the side walls 202d and 202e and adjacent to the rack entrance 204) on the rack 200, the first rack wireless communication device 230 and the second rack wireless communication device 240 may be each located in any position on or around the rack 200 that would enable the wireless communications discussed below such as, for example, a central-and-back position (i.e., midway between the side walls 202d and 202e and opposite the rack 200 from rack entrance 204, adjacent the rack 200 and affixed to some structure other than the rack 200, etc.). Furthermore, while the illustrated embodiment of FIG. 2 shows that the rack 200 includes two rack wireless communication devices 230 and 240, in some other embodiments, the rack 200 may include fewer (i.e., one) or more (i.e., three or more) rack wireless communication devices while remaining within the scope of the present disclosure.

As illustrated, the side wall 202d may include a plurality of device coupling features 208 that define a plurality of device housings 210. While not illustrated, the side wall 202e may include similar device coupling features that operate to define the plurality of device housings 210. In the embodiments discussed below, the plurality of device housings 210 are substantially similar and thus each described as being utilized in coupling a computing device (e.g., a server device) to the rack 200. However, one of skill in the art in possession of the present disclosure will recognize that the plurality of device housings 210 may differ, and may be used to couple any of a variety of different devices to the rack 200. For example, a first device housing 210 may be described as being utilized in coupling a networking device (e.g., a network switch) to the rack 200, while a second device housing 210 may be described as being utilized in coupling a server device to the rack 200. In specific embodiments discussed below, the rack 200 is described as a conventional 19-inch rack that is configured to house devices having widths of approximately 19 inches (e.g., as measured between the side walls 202d and 202e of the rack 200), and that includes a height of 42 rack units ("42U", or approximately 1.867 meters) such that the rack 200 may include forty two standard sized devices (e.g., forty one server devices and a switch device) that are coupled in the plurality of device housings 210. However, the teachings of the present disclosure are not intended to be limited to this specific embodiment, and one of skill in the art will recognize that those teachings may be applied to "half-height" racks, horizontal racks, and/or other racks known in the art while remaining within the scope of the present disclosure.

Figure 3A:
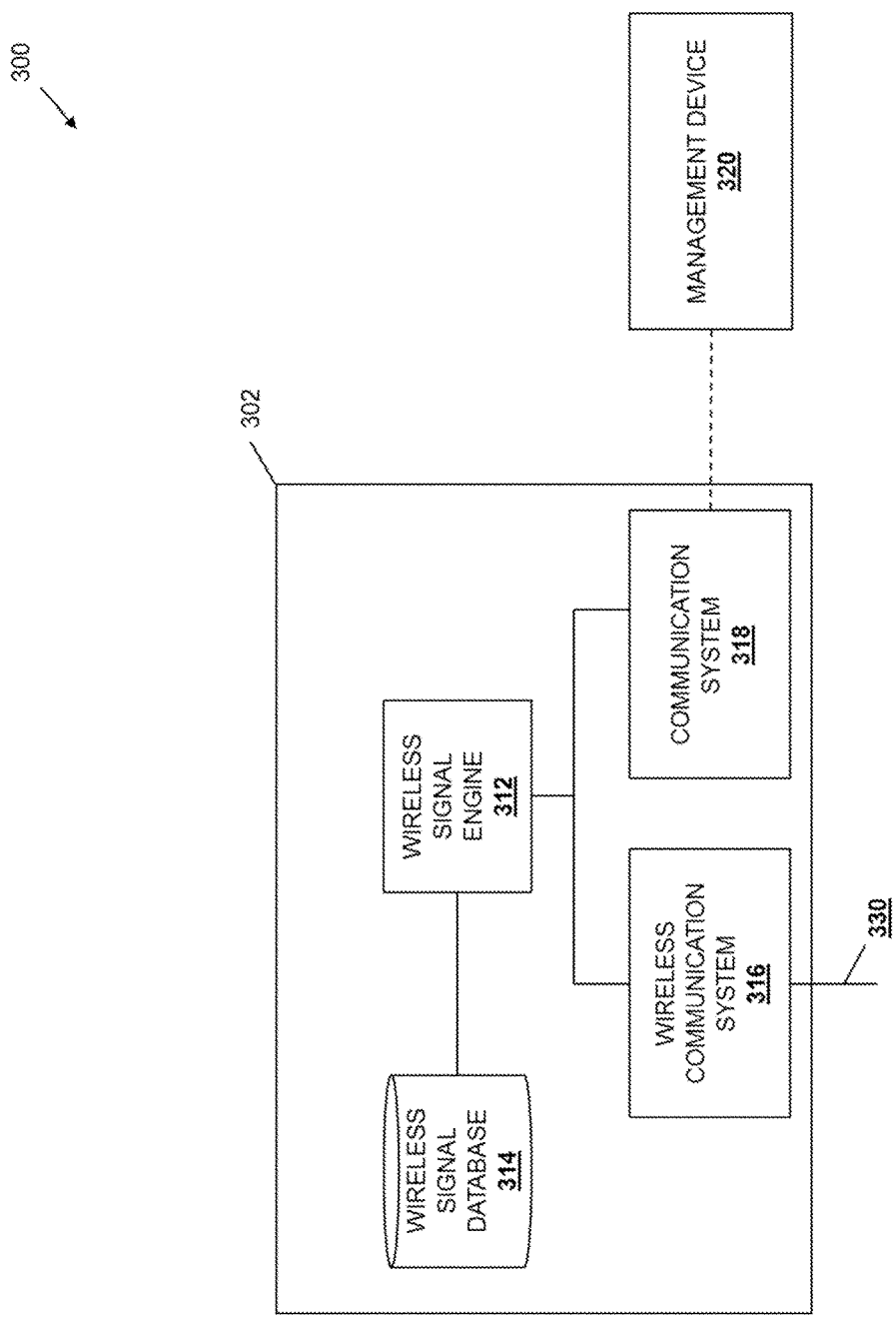
FIG. 3A is a schematic view illustrating an embodiment of a rack wireless communication device that may be positioned on the rack of FIG. 2.

Referring now to FIG. 3A, an embodiment of a rack wireless communication device 300 is illustrated that may be the rack wireless communication devices 230 and/or 240 discussed above with reference to FIG. 2, and/or any of the other rack wireless communication devices discussed below. The rack wireless communication device 300 may be the IHS 100 discussed above with reference to FIG. 1 and/or may include some or all of the components of the IHS 100. In specific embodiments discussed below, the rack wireless communication device 300 is described as a BLUETOOTH® low energy (BLE) wireless communication device that is utilized in determining rack locations. However, in other embodiments, the rack wireless communication device 300 may be other types of wireless communication devices (e.g., Wifi communication devices, Near Field Communication (NFC) wireless devices, etc.) while remaining within the scope of the present disclosure. The rack wireless communication device 300 includes a chassis 302. While not illustrated, one or more of the surfaces on the chassis 302 of the rack wireless communication device 300 may include rack coupling features for coupling the rack wireless communication device 300 to walls on the rack 200 and/or adjacent the rack 200.

The rack wireless communication device 300 may include a processing system (not illustrated, but which may be the processor 102 discussed above with reference to FIG. 1) and a memory system (not illustrated, but which may be the system memory 114 discussed above with reference to FIG. 1) that includes instructions that, when executed by the processing system, cause the processing system to provide a wireless signal engine 312 that is configured to perform the functions of the wireless signal engines and rack wireless communication device discussed below. The wireless signal engine 312 is coupled to a wireless communication system 316 (e.g., via a coupling between the processing system and the wireless communication system 316) that includes one or more antennas 330 that, in the illustrated embodiment, extend from a surface of the wireless communication device 300. However, antennas that are internal to the chassis 302 will fall within the scope of the present disclosure as well. As discussed above, in different embodiments, the wireless communication system 316 may be any of a variety of wireless communication systems known in the art such as, for example, a short-range wireless communication system (e.g., a BLE wireless communication system, NFC wireless communication devices, etc.) and/or other wireless communications system providing similar or different wireless communication ranges. The wireless signal engine 312 is also coupled to a storage device (not illustrated, but which may be the storage device 108, discussed above with reference to FIG. 1, that is coupled to the processing system) that includes a wireless signal database 314. Although the wireless signal database 314 is illustrated as part of the rack wireless communication device 300, in some embodiments, the wireless signal database 314 may be a separate component from the rack wireless communication device 300 in FIG. 3A (e.g., connected to the rack wireless communication device 300 via a cable or wireless connection) while remaining within the scope of the present disclosure. Furthermore, any type of database provided on any storage subsystem that is accessible by the rack wireless communication device 300 is envisioned as falling within the scope of the present disclosure. As discussed in further detail below, the wireless signal database 314 may store a variety of wireless communication information, rack identification information, and/or other rack location information that may depend on the specific functionality desired in the rack location determination systems discussed below, and that may be retrieved by the rack wireless communication device 300 (e.g., over a network), provided (e.g., by an administrator), and/or otherwise included in the rack wireless communication device 300 using methods known in the art.

In some embodiments, rack identification information stored in the wireless signal database 314 may include a rack identifier that distinguishes a particular rack from other racks, an aisle identifier that distinguishes an aisle that includes a rack from other aisles that include other racks, a room identifier that distinguishes a room that includes a rack from other rooms that include other racks, a datacenter identifier that distinguishes a datacenter that includes a rack from other datacenters that include other racks, and/or any other information that may be utilized in distinguishing a rack from other racks in a datacenter. For example, a datacenter may include many rooms (e.g., 50), each room may include many aisles (e.g., 200), each aisle may include racks (100), and information about those and other features of the datacenter may be provided as rack identification information in the wireless signal database 314.

Figure 3B:
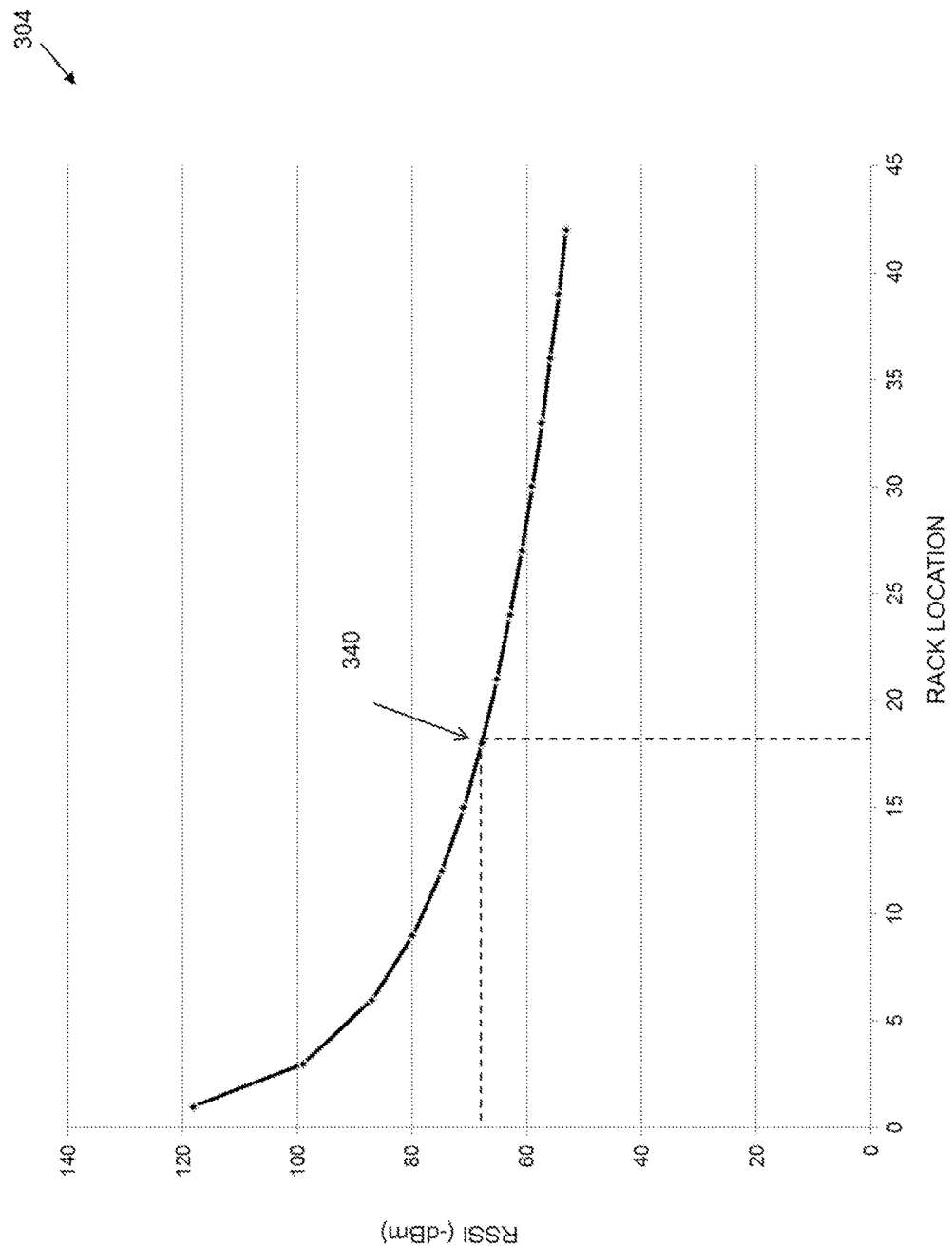
FIG. 3B is a graph illustrating an embodiment of a first wireless signal strength/rack location mapping that may be stored in the rack wireless communication device of FIG. 3A.

In some embodiments, rack location information stored in the wireless signal database 314 may include one or more signal strength/rack location mappings. FIGS. 3B and 3C illustrate embodiments of different signal strength/rack location mappings 304 and 305 that may be stored in the wireless signal database 314 of the rack wireless communication device 300. For example, in the embodiments discussed below, the signal strength/rack location mapping 304 in FIG. 3B may be stored in a wireless signal database 314 of the rack wireless communication device 230 that is located on the top wall 202a of the rack 200 in FIG. 2; and the signal strength/rack location mapping 305 in FIG. 3C may be stored in a wireless signal database 314 of the rack wireless communication device 240 that is located on the bottom wall 202b of the rack 200 in FIG. 2. In the illustrated embodiment, the signal strength/rack location mapping 304 includes a rack location provided on the x-axis and a received signal strength identification (RSSI) provided on the y-axis. As discussed below, the RSSI may be based on an emitted signal strength of a signal provided by the rack wireless communication device 230 (i.e., a particular signal strength of a signal provided by the rack wireless communication device 230 may result in the RSSI at each of the rack locations indicated on the X-axis). In an embodiment including a 42U rack that provides 42 device housings and the rack wireless communication device 230 located on the top wall of the 42U rack, the signal strength/rack location mapping 304 illustrates how the RSSI of a wireless signal having a particular signal strength that is provided by the rack wireless communication device 230 will vary at different rack locations and correspond to those rack locations in the rack (e.g., in the illustrated embodiment, from approximately 120-dB at a rack location immediately adjacent the rack wireless communication device 230 to approximately 50-dB at a rack location that is opposite the rack 200 from the rack wireless communication device 230). As such, the signal strength/rack location mapping 304 may be associated with the location of the rack wireless communication device 230 (e.g., on the top wall 202a of the rack 200). In a specific example, point 340 on the signal strength/rack location mapping 304 indicates that, for a particular signal strength of a signal provided by the rack wireless communication device 230, a computing device in a rack location that is approximately 18U from the rack wireless communication device 230 will detect an RSSI of approximately 70-dB.

Similarly, in the illustrated embodiment of FIG. 3C, the signal strength/rack location mapping 305 includes a rack location provided on the x-axis and a received signal strength identification (RSSI) provided on the y-axis. As discussed below, the RSSI may be based on an emitted signal strength of a signal provided by the rack wireless communication device 240 (i.e., a particular signal strength of a signal provided by a rack wireless communication device 240 may result in the RSSI at each of the rack locations indicated on the X-axis). In an embodiment including a 42U rack that provides 42 device housings and the signaling device 240 located on the bottom wall of the 42U rack, the signal strength/rack location mapping 305 illustrates how the RSSI of a wireless signal having a particular signal strength that is provided by the rack wireless communication device 240 will vary at different rack locations and correspond to those rack locations in the rack (e.g., from approximately −120 dB at a rack location immediately adjacent the rack wireless communication device 240 to approximately −50 dB at a rack location that is opposite the rack 200 from the rack wireless communication device 240). As such, the signal strength/rack location mapping 305 may be associated with the location of the rack wireless communication device 240 (e.g., on the bottom wall 202b of the rack 200). In a specific example, point 350 on the signal strength/rack location mapping 306 indicates that, for a particular signal strength of a signal provided by the rack wireless communication device 240, a computing device in a rack location that is approximately 30U from the rack wireless communication device 240 will receive an RSSI of approximately −75 dB.

In an embodiment, the signal strength/rack location mappings provided in the rack wireless communication device(s) may be determined in a variety of manners. For example, a signal strength/rack location mapping may be determined theoretically using an equation such as:

$$RSSI(dBm) = -10n * \log_{10}(d) - A$$

such that:

$$d = 10^{((RSSI(dBm)+A)/-10n)}$$

where RSSI(dBM) is the received signal strength of the signal in Decibel-milliwatts, n is the signal attenuation factor (which may vary based on the environment), d is the distance in meters from the location where the signal is being broadcast, and A is the reference/particular signal strength (in dBM) at a distance of 1 meter from the rack wireless communication device that is emitting the wireless signal. In experimental embodiments, the signal strength/rack location mappings 304 and 305 were determined using n=4 and A=−64.

In another example, a signal strength/rack location mapping may be determined empirically by taking measurements at different locations in a rack. For example, a wireless signal may be broadcast from one of the rack wireless communication devices on the rack at a particular signal strength, and one or more readings may be taken of that wireless signal at each of the U locations in the rack to determine the RSSI at that U location. In embodiments where multiple readings are taken at a given U location of the wireless signal being broadcast from the rack wireless communication device, those readings may be averaged to determine an expected RSSI at that U location. That process may be repeated for each rack wireless communication device on the rack in order to determine a rack location/signal strength mapping for each of the rack wireless communication devices.

While specific embodiments of signal strength/rack location mappings and methods for determining signal strength/rack location mappings are illustrated and described herein that associate a plurality of RSSIs with rack locations in a rack, other signal strength or wireless signal characteristics may be mapped to a rack location, and other methods may be used to determine those signal strength and/or wireless signal mappings, while remaining within the scope of the present disclosure. As such, other wireless communication signal characteristics, features, and/or measurements may be associated with rack locations in a rack, provided in the wireless signal database 314, and used in the method below in substantially the same manner as described for the RSSI.

Referring back to FIG. 3A, in some embodiments, the rack wireless communication 300 may also include a communication system 318 that is coupled between the wireless signal engine 312 (e.g., via a coupling between the processing system and the communication system 318) and a management device 320. The communication system 318 is illustrated as coupled to the wireless signal engine 312, but may be combined with and/or include the wireless communication system 316 while remaining within the scope of the present disclosure. In some embodiments, the management device 320 may be a datacenter management information handling system that is configured to monitor/manage the identification and/or location of each rack wireless communication devices (e.g., the rack wireless communication devices 230 and/or 240 of FIG. 2), the rack (e.g., the rack 200), and/or the rack devices (e.g., the server devices discussed below). In a specific embodiment, the management device 320 may include a remote access controller such as, for example, a Dell Remote Access Controller (iDRAC) that is available from the assignee of the present disclosure and that is configured to perform remote management functions (as well as other functions) known in the art. For example, a remote access controller coupled to the rack wireless communication device 300 (e.g., provided in the rack 200) may provide for communication with a management system operated by an administrator.

Figure 4A:
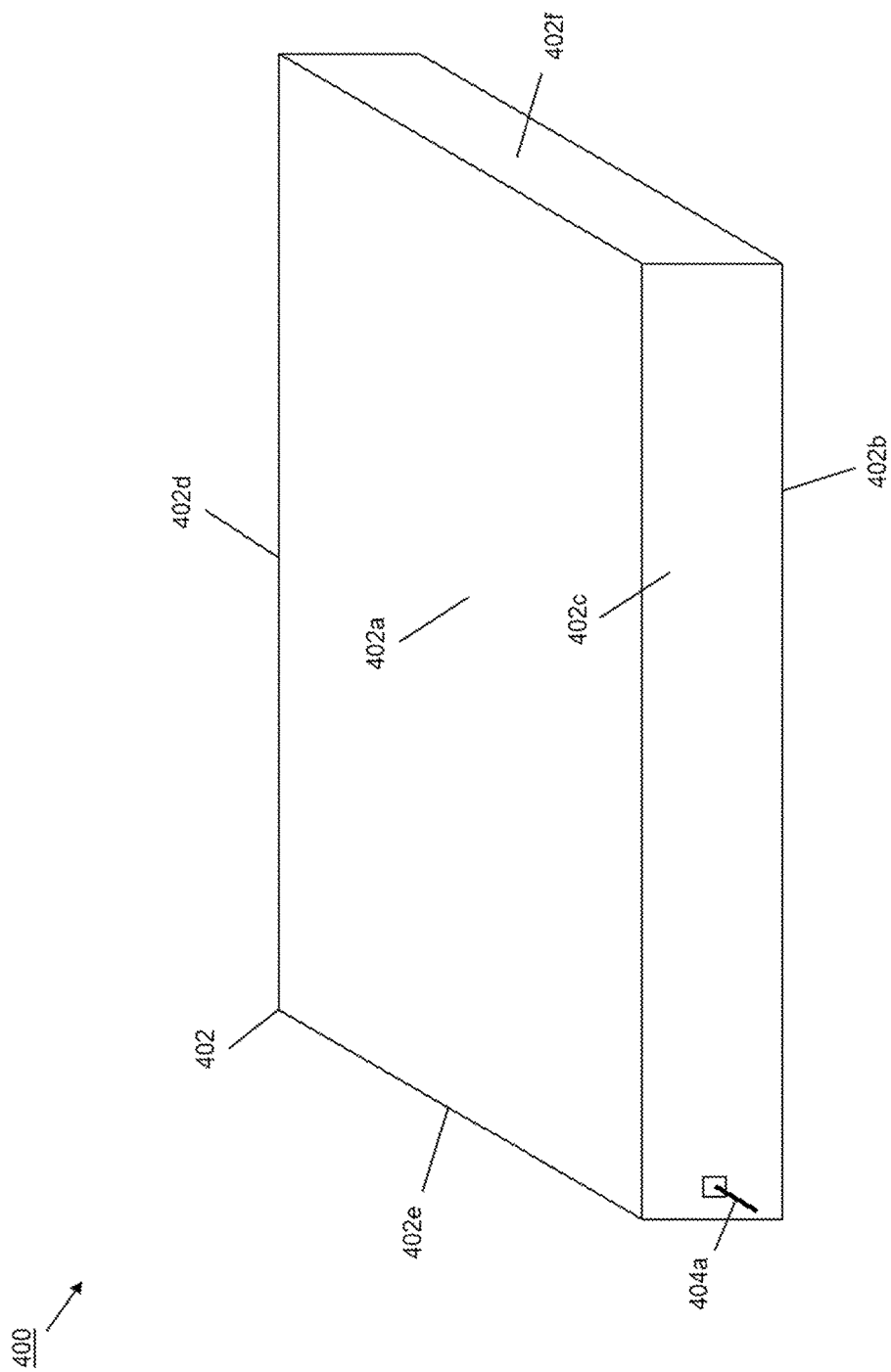
FIG. 4A is a perspective view illustrating an embodiment of a server device that may be positioned in the rack of FIG. 2.
Figure 4B:
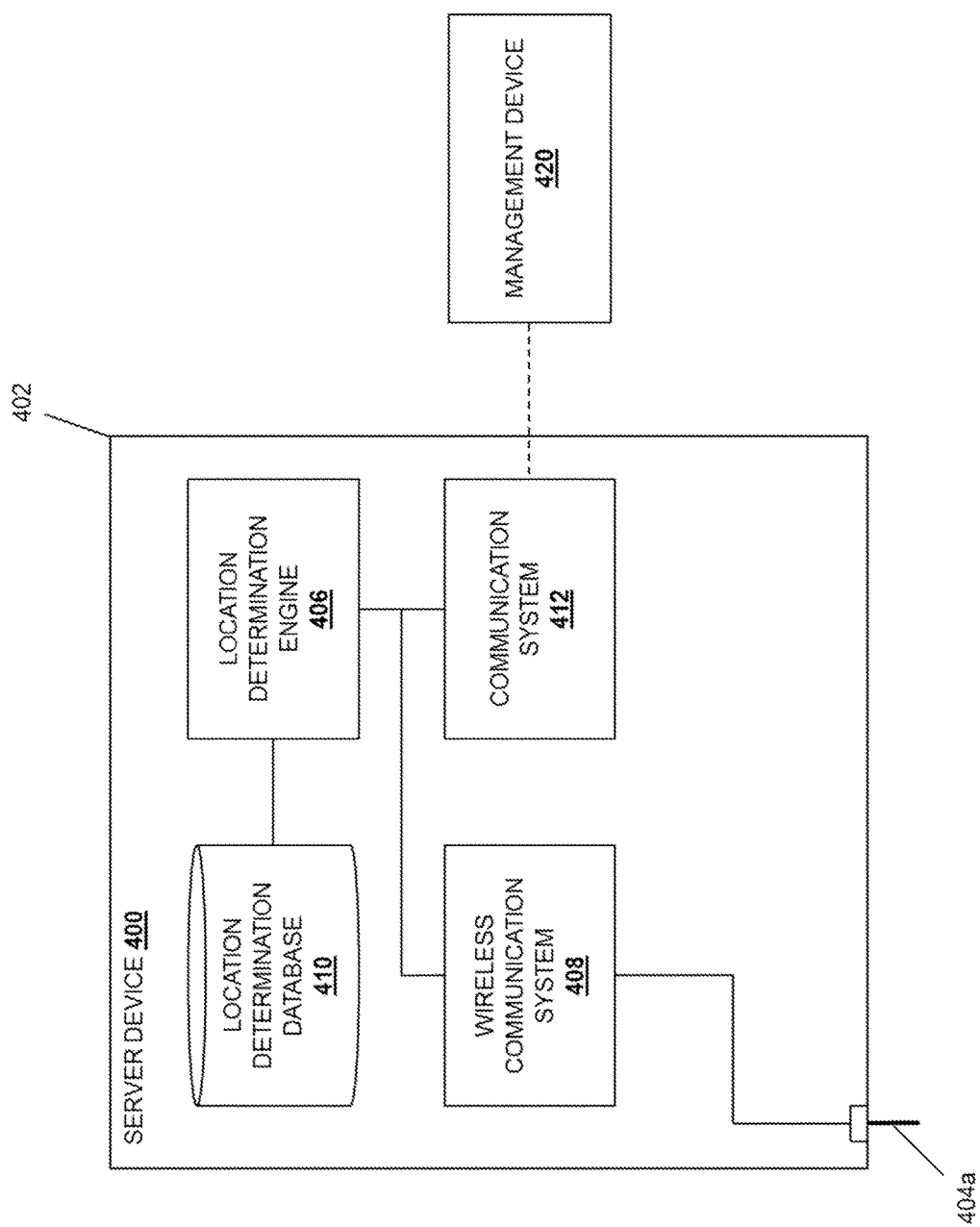
FIG. 4B is a schematic view illustrating an embodiment of the server device of FIG. 4A.

Referring now to FIGS. 4A and 4B, an embodiment of a server device 400 is illustrated. In an embodiment, the server device 400 may be the IHS 100 discussed above with reference to FIG. 1 and/or may include some or all of the components of the IHS 100. In specific embodiments discussed below, the server device 400 is illustrated and described as a data center server. However, in other embodiments the server device 400 may be provided instead by storage devices (e.g., in a Storage Area Network (SAN)), switches, and/or other types of rack devices while remaining within the scope of the present disclosure. The server device 400 includes a chassis 402 having a top surface 402a, a bottom surface 402b that is located opposite the chassis 402 from the top surface 402a, a front surface 402c extending between the top surface 402a and the bottom surface 402b, a rear surface 402d located opposite the chassis 402 from the front surface 402c and extending between the top surface 402a and the bottom surface 402b, and a pair of side surfaces 402e and 402f located opposite the chassis 402 from each other and extending between the top surface 402a, the bottom surface 402b, the front surface 402c, and the rear surface 402d. While not illustrated, each of the side surfaces 402e and 402f (as well as other surfaces) on the server device 400 may include rack coupling features for engaging the device coupling features 208 on the rack 200 to couple the server device 400 to the rack 200.

In the embodiments discussed below, an antenna 404a extends from the front surface 402c of the server device 400 at a location that is adjacent the side surface 402e. However, antennas that are internal to the chassis 402 will fall within the scope of the present disclosure as well. In the illustrated embodiment, the antenna 404a includes a single antenna. However, different numbers of antennas (e.g., a pair of antennas, more than two antennas, etc.) will fall within the scope of the present disclosure. In the embodiments discussed below, the antenna 404a is provided with a BLE wireless communication system, but may be provided with other wireless communication systems (e.g., NFC wireless communication systems, WiFi wireless communication systems, etc.) while remaining within the scope of the present disclosure. While the antenna 404a is illustrated with a straight line, one of skill in the art in possession of the present disclosure will recognize that the antenna 404a may include a three-dimensional shape/configuration that provides a width and height (as well as the length that is illustrated). For example, the antenna 404a may include a width of approximately 5 millimeters and a height of approximately 1-2 millimeters.

Referring now to FIG. 4B, the chassis 402 of the server device 400 may house a processing system (not illustrated, but which may be the processor 102 discussed above with reference to FIG. 1) and a memory system (not illustrated, but which may be the system memory 114 discussed above with reference to FIG. 1) that includes instructions that, when executed by the processing system, cause the processing system to provide a location determination engine 406 that is configured to perform the functions of the location determination engines and server devices discussed below. The location determination engine 406 is coupled to a wireless communication system 408 (e.g., via a coupling between the processing system and the wireless communication system 408) that is coupled to the antenna 404a. As discussed above, the wireless communication system 408 may be any of a variety of wireless communication systems known in the art, such as, for example, a BLE communication system, an NFC communication system, a Wifi communication system, and/or other wireless communication system known in the art.

The location determination engine 406 is also coupled to a storage device (not illustrated, but which may be the storage device 108, discussed above with reference to FIG. 1, that is coupled to the processing system) that includes a location determination database 410. Although the location determination database 410 is illustrated as part of the server device 400, in some embodiments, the location determination database 410 may be a separate component from the server device 400 in FIG. 4B (e.g., connected to the server device 400 via a cable or wireless connection) while remaining within the scope of the present disclosure. Furthermore, any type of database provided on any storage subsystem that is accessible by the server device 400 is envisioned as falling within the scope of the present disclosure. In different embodiments, the location determination database 410 may receive and/or store a variety of wireless communication information and/or rack location information that may depend on the specific functionality desired for the rack location determination systems discussed below.

Figure 4C:
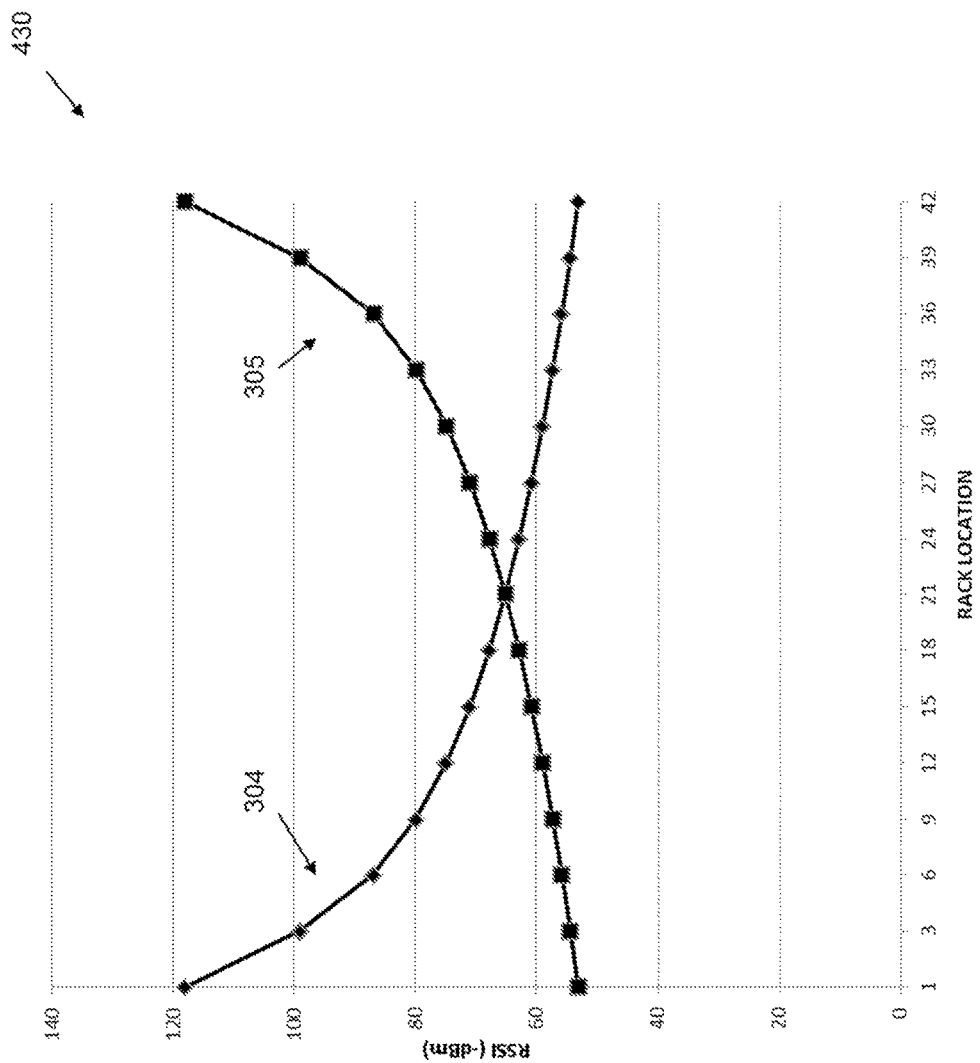
FIG. 4C is a graph illustrating an embodiment of the first and the second wireless signal strength/rack location mappings of FIGS. 3B and 3C that may be stored in the server device of FIGS. 4A and 4B.

In an embodiment, the rack location information stored in the location determination database 410 includes one or more signal strength/rack location mappings. For example, FIG. 4C illustrates a signal strength/rack location mapping 430 that is stored in the location determination database 410. In the illustrated embodiment, the signal strength/rack location mapping 430 includes the signal strength/rack location mapping 304 discussed above with reference to FIG. 3B and the signal strength/rack location mapping 305 discussed above with reference to FIG. 3C. As such, in some embodiments, the signal strength/rack location mapping 304 may be provided to the server device 400 by the rack wireless communication device 230, and the signal strength/rack location mapping 305 may be provided to the server device 400 by the rack wireless communication device 240. As discussed above, each of the signal strength/rack location mapping 304 and the signal strength/rack location mapping 305 provides rack locations (provided on the x-axis) associated with an RSSI (provided on the y-axis) for signals having particular signal strengths provided by the rack wireless communication devices 230 and 240. However, the signal strength/rack location mapping 430 need not be provided to the server device 400 by the signaling devices 230 and 240, and instead, the signal strength/rack location mapping 430 may include signal strength/rack location mapping(s) provided by an administrator, a manufacturer, a management system, and/or other entities. In some embodiments, the location determination engine 406, the wireless communication system 408, the location determination database 410, and/or other components in the server device 400 provide for a wireless communication subsystem that allows the server device 400 to determine its location in a rack as discussed below.

Referring back to FIG. 4B, the server device 400 may also include a communication system 412 that is coupled between the location determination engine 406 (e.g., by a coupling between the processing system and the communication system 412) and a management device 420. In some embodiments, the management device 420 may be different than or identical to the management device 320 of FIG. 3A. Thus, the management device 420 may be a datacenter management information handling system that is configured to monitor/manage the identification and/or the location of each rack wireless communication devices (e.g., rack wireless communication devices 230 and/or 240 of FIG. 2), the rack (e.g., the rack 200), and/or rack devices (e.g., the server devices discussed below). In a specific embodiment, the management device 420 may include a remote access controller such as, for example, the iDRAC that is available from the assignee of the present disclosure and that is configured to perform remote management functions (as well as other functions) known in the art. For example, a remote access controller coupled to the server device 400 may provide for communication with a management system operated by an administrator.

Figure 5:
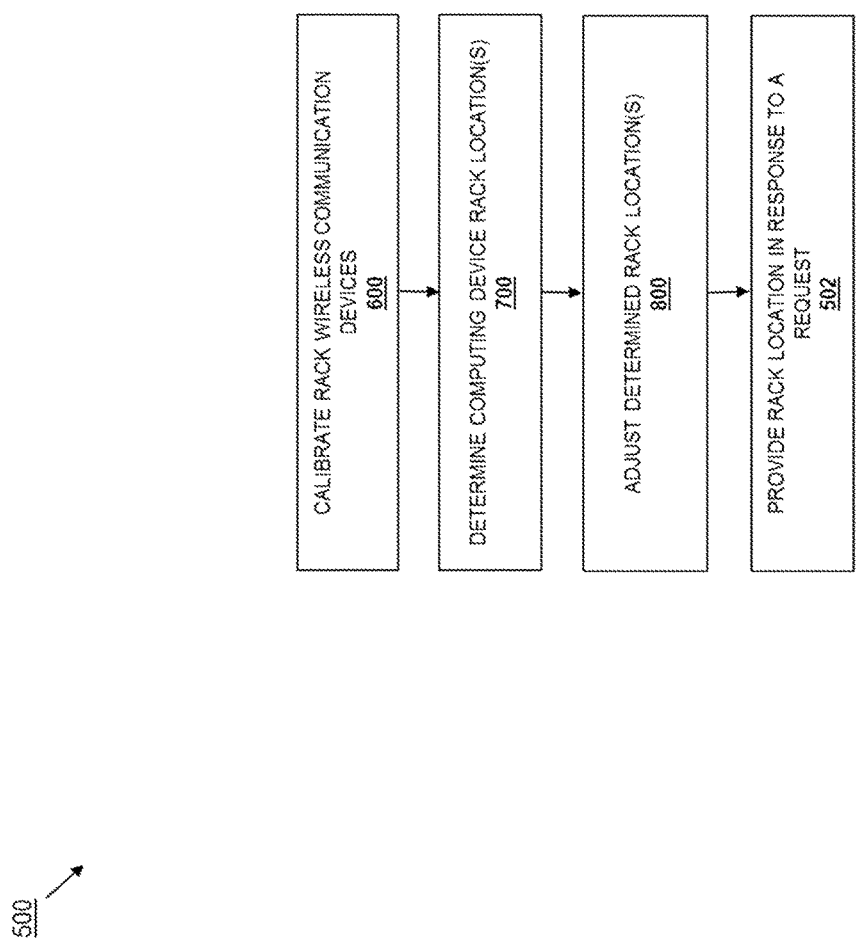
FIG. 5 is a flow chart illustrating an embodiment of a method for determining a rack location.

Referring now to FIG. 5, an embodiment of a method 500 for determining a rack location of a computing device is illustrated. As discussed below, as a datacenter may house thousands of computing devices, and in many situations it may be desirable for a datacenter administrator to locate/identify a particular computing device (e.g., a server device) in a rack that is included in that datacenter. The method 500 provides computing devices that may determine their locations within a rack and datacenter and provide that determined rack location to a datacenter administrator (e.g., via a management device operated by the administrator). As discussed below, the determination of a rack location may utilize wireless signal strength/rack location mapping(s) with wireless signals provided by rack wireless communication device(s) located on the rack that houses the computing device. Such techniques may be especially useful for large datacenters that include a relatively large number of rooms, with each room housing a relatively large number of racks, and each rack housing a relatively large number of computing devices. For the purpose of clarity, each of the computing devices in the following discussion is described as a server device. However, computing devices may be provided by a variety of other computing devices (e.g., switches, storage devices, and/or other rack devices) known in the art while remaining within the scope of the present disclosure.

In the embodiment illustrated in FIG. 5, the method 500 is performed via sub-methods 600, 700, and 800, along with block 502. However, the illustrated embodiment of the method 500 is merely provided as an example, and any of the performances of the sub-method 600 in which rack wireless communication devices are calibrated, sub-method 700 in which the rack locations of computing devices are determined, sub-method 800 in which determined rack locations are adjusted, and block 502 in which a rack location is provided in response to a request, may be omitted, performed in a different sequence, and/or modified while remaining within the scope of the present disclosure.

Figure 6:
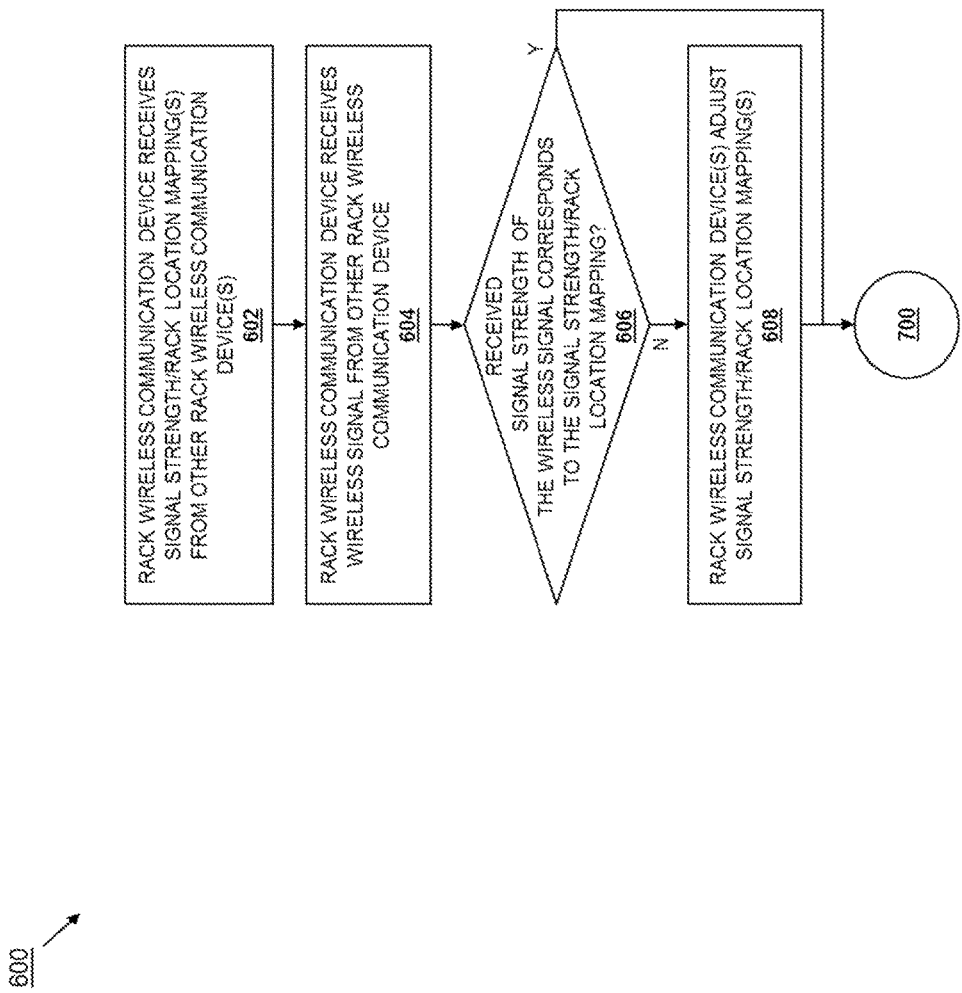
FIG. 6 is a flow chart illustrating an embodiment of a sub-method for calibrating rack wireless communication devices that may be performed in the method of FIG. 5.

Referring now to FIG. 6, an embodiment of the method 500 may begin with the sub-method 600. The sub-method 600 is generally directed to calibrating each rack wireless communication device that is coupled to a rack by sharing the signal strength/rack location mapping included in that rack wireless communication device with the other rack wireless communication device(s) that are coupled to that rack to determine the accuracy of that signal strength/rack location mapping and adjust that signal strength/rack location mapping if needed. As such, signal strength/rack location mappings provided in any rack wireless communication device that is coupled to a rack may be made more accurate for use in the method 500 (e.g., sub-methods 700 and/or 800) following sub-method 600.

The sub-method 600 begins at block 602 where a rack wireless communication device receives signal strength/rack location mapping(s) from other rack wireless communication device(s). For example, with reference to FIG. 9A, the rack wireless communication devices 230 and 240 are coupled to the top wall 202*a* and the bottom wall 202*b*, respectively, of the rack 200. However, as discussed above, in other embodiments the rack 200 may include more rack wireless communication devices (three or more rack wireless communication devices) that are each coupled to a different location on or adjacent the rack 200 while remaining within the scope of the present disclosure, and one of skill in the art in possession of the present disclosure will recognize how the calibration operations according to sub-method 600 may be performed with additional rack wireless communication devices on or adjacent the rack 200 while remaining within the scope of the present disclosure.

As illustrated in FIG. 9A, the rack wireless communication devices 230 and 240 may exchange their respective wireless signal strength/rack location mappings (e.g., the wireless signal strength/rack location mapping 304 discussed with reference to FIG. 3B and the wireless signal strength/rack location mapping 305 discussed with reference to FIG. 3C) via one or more wireless communications 902. In embodiments where the rack wireless communication devices 230 and 240 are BLUETOOTH® low energy (BLE) wireless communication devices, each of the rack wireless communication devices 230 and 240 may operate in a BLE advertising mode to share its signal strength/rack location mapping with the other, and operate in a BLE scanning mode to receive the signal strength/rack location mapping of the other. In different embodiments, the rack wireless communication devices (e.g., the rack wireless communication devices 230, 240, and other rack wireless communication devices) may be distinguished from each other using identifying information such as a universally unique identifier (UUID), Major values, Minor values, and/or other identifying information known in the art that may be used to distinguish a rack wireless communication device from other rack wireless communication devices.

For example, the wireless signal engine 312 in the rack wireless communication device 230 may retrieve the signal strength/rack location mapping 304 from the wireless signal database 314 in the rack wireless communication device 230 and provide the wireless signal strength/rack location mapping 304 through the wireless communication system 316 and the antenna 330 in the rack wireless communication device 230 to the rack wireless communication device 240 via the wireless communication 902. Simultaneously or subsequently, the wireless signal engine 312 in the rack wireless communication device 240 may retrieve the wireless signal strength/rack location mapping 305 from the wireless signal database 314 in the rack wireless communication device 240 and provide the wireless signal strength/rack location mapping 305 through the wireless communication system 316 and the antenna 300 in the rack wireless communication device 240 to the rack wireless communication device 230 via the wireless communication 902. As such, the wireless signal engine 312 of the rack wireless communication device 230 may receive the wireless signal strength/rack location mappings 305 from the rack wireless communication device 240 via the wireless communication system 316 and antenna 330 of the rack wireless communication device 230, and the wireless signal engine 312 of the rack wireless communication device 240 receive the wireless signal strength/rack location mappings 304 from the rack wireless communication device 230 via the wireless communication system 316 and antenna 330 of the rack wireless communication device 240.

The sub-method 600 then proceeds to block 604 where the rack wireless communication device receives a wireless signal from other rack wireless communication device(s). Continuing with the example illustrated in FIG. 9A, the wireless signal engine 312 of the rack wireless communication device 230 may use the communication system 316 and the antenna 330 of the rack wireless communication device 230 to receive a first wireless signal that is sent from the rack wireless communication device 240. Simultaneously or subsequently, the wireless signal engine 312 of the rack wireless communication device 240 may use the wireless communication system 316 and the antenna 330 of the rack wireless communication device 240 to receive a second wireless signal that is sent from the rack wireless communication device 230. In an embodiment, the sending of the wireless signals by the rack wireless communication devices to each other may include providing the wireless signal at a power or signal strength that is associated with its respective signal strength/rack location mapping. For example, the signal strength/rack location mapping 304 may be determined based on a particular emitted signal strength by the rack wireless communication device 230, and the rack wireless communication device 230 may provide the second wireless signal to the rack wireless communication device 240 at block 604 at that particular emitted signal strength. Similarly, the signal strength/rack location mapping 305 may be determined based on a particular emitted signal strength by the rack wireless communication device 240, and the rack wireless communication device 240 may provide the first wireless signal to the rack wireless communication device 230 at block 604 at that particular emitted signal strength.

In an embodiment, upon receiving the wireless signal from another rack wireless communication device at block 604, a received signal strength of the received wireless signal may be determined. In the example of FIG. 9A, the wireless signal engine 312 of the rack wireless communication device 230 may determine a first received signal strength of the first wireless signal provided by the rack wireless communication device 240. Similarly, the wireless signal engine 312 of the rack wireless communication device 240 may determine a second received signal strength of the second wireless signal provided by the rack wireless communication device 230. In some embodiments, the received signal strength of the received wireless signal may be determined at another subsequent block (e.g., 606) of the sub-method 600. While the receiving of the signal strength/rack location mapping is illustrated and described at block 602, and the receiving of the wireless signal is illustrated and described at block 604, in some embodiments, the blocks 602 and 604 may be combined. For example, a rack wireless communication device (e.g., the rack wireless communication device 230) may receive the wireless signal from another rack wireless communication device (e.g., the rack wireless communication device 240) that includes its signal strength/rack location mapping (e.g., the signal strength/rack location mapping 305).

The sub-method 600 then continues to decision block 606 where the rack wireless communication device determines whether the received signal strength of the wireless signal received from the other rack wireless communication device(s) corresponds to the wireless signal strength/rack location mapping received from the other rack wireless communication device(s). In an embodiment, the wireless signal engine in the rack wireless communication device may compare the received signal strength of the wireless signal (received from the other rack wireless communication device and determined at block 604) to the wireless signal strength/rack location mapping (received at block 602 from the other rack wireless communication device) to determine whether that received signal strength corresponds to the signal strength/rack location mapping. For example, the wireless signal engine 312 of the rack wireless communication device 230 may compare the first received signal strength of the first wireless signal received from the rack wireless communication device 240 to the wireless signal strength/rack location mapping 305 that was received from the rack wireless communication device 240. Similarly, the wireless signal engine 312 of the rack wireless communication device 240 may compare the second received signal strength of the second wireless signal received from the rack wireless communication device 230 to the wireless signal strength/rack location mapping 304 that was received from the rack wireless communication device 230.

In an embodiment of decision block 606, with reference to FIG. 3B and the signal strength/rack location mapping 304 that is provided by the rack wireless communication device 230 to the rack wireless communication device 240, the rack wireless communication device 240 may determine its location on the rack 200 (e.g., by retrieving it from the wireless signal database 314, receiving it from an administrator, retrieving it from the management device 320, determining it using the techniques discussed below, and/or determining it using other methods known in the art) and then reference the signal strength/rack location mapping 304 to determine whether the second received signal strength of the second wireless signal corresponds to the signal strength provided on the signal strength/rack location mapping 304 for the known location of the rack wireless communication device 240. For example, the rack wireless communication device 240 may determine that it is located on the bottom wall 202b of the rack 200 adjacent the 42U device housing on the rack 200, and as per the signal strength/rack location mapping 304, should detect an RSSI of the second wireless signal of approximately 55-dBm. The rack wireless communication device 240 may then determine whether the second received signal strength of the first wireless signal corresponds to 55-dBm.

Similarly, with reference to FIG. 3C and the signal strength/rack location mapping 305 that is provided by the rack wireless communication device 240 to the rack wireless communication device 230, the rack wireless communication device 230 may determine its location on the rack 200 (e.g., by retrieving it from the wireless signal database 314, receiving it from an administrator, retrieving it from the management device 320, determining it using the techniques discussed below, and/or determining it using other methods known in the art) and then referencing the signal strength/rack location mapping 305 to determine whether the first received signal strength of the first wireless signal corresponds to the signal strength provided on the signal strength/rack location mapping 305 for the known location of the rack wireless communication device 230. For example, the rack wireless communication device 230 may determine that it is located on the top wall 202a of the rack 200 adjacent the 1U device housing on the rack 200, and as per the signal strength/rack location mapping 305, should detect an RSSI from the first wireless signal of approximately 55-dBm. The rack wireless communication device 230 may then determine whether the first received signal strength of the first wireless signal corresponds to 55-dBm.

If, at decision block 606, it is determined that the received signal strength of wireless signal provided by the other rack wireless communication device does not correspond to the signal strength/rack location mapping provided by the other rack wireless communication device, the sub-method 600 proceeds to block 608 where the other rack wireless communication device adjusts its signal strength/rack location mapping. In an embodiment, the wireless signal engine 312 of the rack wireless communication device 230 may determine that the first received signal strength of the first wireless signal received from the rack wireless communication device 240 does not correspond to the wireless signal strength/rack location mapping 305 received from the rack wireless communication device 240. For example, the first received signal strength may be 70-dBm, which according to the signal strength/rack location mapping 305 would correspond to the 30U device housing in the rack 200 rather than the 1U device housing in the rack 200. In response, the wireless signal engine 312 of the rack wireless communication device 230 may send an adjustment communication to the rack wireless communication device 240. In an embodiment, the adjustment communication may include the first received signal strength of the first wireless signal, the difference between the first received signal strength of the first wireless signal and the expected signal strength according to the signal strength/rack location mapping 305, the location of the rack wireless communication device 230, and/or any other information that may be used to adjust the signal strength/rack location mapping 305.

Similarly, the wireless signal engine 312 of the rack wireless communication device 240 may determine that the second received signal strength of the second wireless signal received from the rack wireless communication device 230 does not correspond to the wireless signal strength/rack location mapping 304 received from the rack wireless communication device 230. For example, the second received signal strength may be 80-dBm, which according to the signal strength/rack location mapping 304 would correspond to the 10U device housing in the rack 200 rather than the 42U device housing in the rack 200. In response, the wireless signal engine 312 of the rack wireless communication device 240 may send an adjustment communication to the rack wireless communication device 230. In an embodiment, the adjustment communication may include the second received signal strength of the second wireless signal, the difference between the second received signal strength of the second wireless signal and the expected signal strength according to the signal strength/rack location mapping 304, the location of the rack wireless communication device 240, and/or any other information that may be used to adjust the signal strength/rack location mapping 304.

At block 608, the rack wireless communication device(s) adjust the signal strength/rack location mapping(s). In an embodiment, the wireless signal engine 312 in the rack wireless communication device 240 may use the adjustment communication provided by the rack wireless communication device 230 to adjust its wireless signal strength/rack location mapping 305 and update the wireless signal database 314 of the rack wireless communication device 240 with the adjusted wireless signal strength/rack location mapping. For example, the wireless signal engine 312 in the rack wireless communication device 240 may use the second received signal strength of the second wireless signal and the location of the rack wireless communication device 230 (e.g., on the top wall 202a of the rack 202 adjacent the 1U device housing) to adjust the wireless signal strength/rack location mapping 305 so that the RSSI of the wireless signal strength/rack location mapping 305 at the 1U device housing equals the second received signal strength, and in some embodiments may also interpolate the remainder of the wireless signal strength/rack location mapping 305 based on that data point. In another example, the wireless signal engine 312 in the rack wireless communication device 240 may use the second received signal strength of the second wireless signal and location of the rack wireless communication device 230 to adjust the emitted signal strength of the second wireless signal such that the received signal strength of the second wireless signal at the 1U device housing will equal the RSSI indicated by the wireless signal strength/rack location mapping 305 at the 1U device housing.

Similarly, the wireless signal engine 312 in the rack wireless communication device 230 may use the adjustment communication provided by the rack wireless communication device 240 to adjust its wireless signal strength/rack location mapping 304 and update the wireless signal database 314 of the rack wireless communication device 230 with the adjusted wireless signal strength/rack location mapping. For example, the wireless signal engine 312 in the rack wireless communication device 230 may use the first received signal strength of the first wireless signal and the location of the rack wireless communication device 240 (e.g., on the bottom wall 202b of the rack 202 adjacent the 42U device housing) to adjust the wireless signal strength/rack location mapping 304 so that the RSSI of the wireless signal strength/rack location mapping 304 at the 42U device housing equals the first received signal strength, and in some embodiments may also interpolate the remainder of the wireless signal strength/rack location mapping 304 based on that data point. In another example, the wireless signal engine 312 in the rack wireless communication device 230 may use the first received signal strength of the first wireless signal and location of the rack wireless communication device 240 to adjust the emitted signal strength of the first wireless signal such that the received signal strength of the first wireless signal at the 42U device housing will equal the RSSI indicated by the wireless signal strength/rack location mapping 304 at the 42U device housing. While a few examples of the adjustment of signal strength/rack location mappings have been provided, one of skill in the art in possession of the present disclosure will recognize that the signal strength/rack location mappings may be adjusted in a variety of different manners based on the adjustment communications that may include a variety of different information while remaining within the scope of the present disclosure. Furthermore, the sub-method 600 may be looped one or more times to adjust and/or verify adjustments such that the signal strength/rack location mappings are made as accurate as possible.

If, at decision block 606, the received signal strength of the wireless signal provided by the other rack wireless communication device corresponds to the signal strength/rack location mapping provided by that rack wireless communication device, or following block 608, the sub-method 600 may proceed to the sub-method 700. The sub-method 700 is generally directed to determining the rack location of computing devices in a rack by having those computing devices receive wireless signals from the rack wireless communication device(s) in the rack, and comparing the signal strengths of those wireless signals to signal strength/rack location mappings to estimate the location of the computing device in the rack. As such, any computing device positioned in a rack with at least one rack wireless communication device may estimate its location in that rack.

Figure 7:
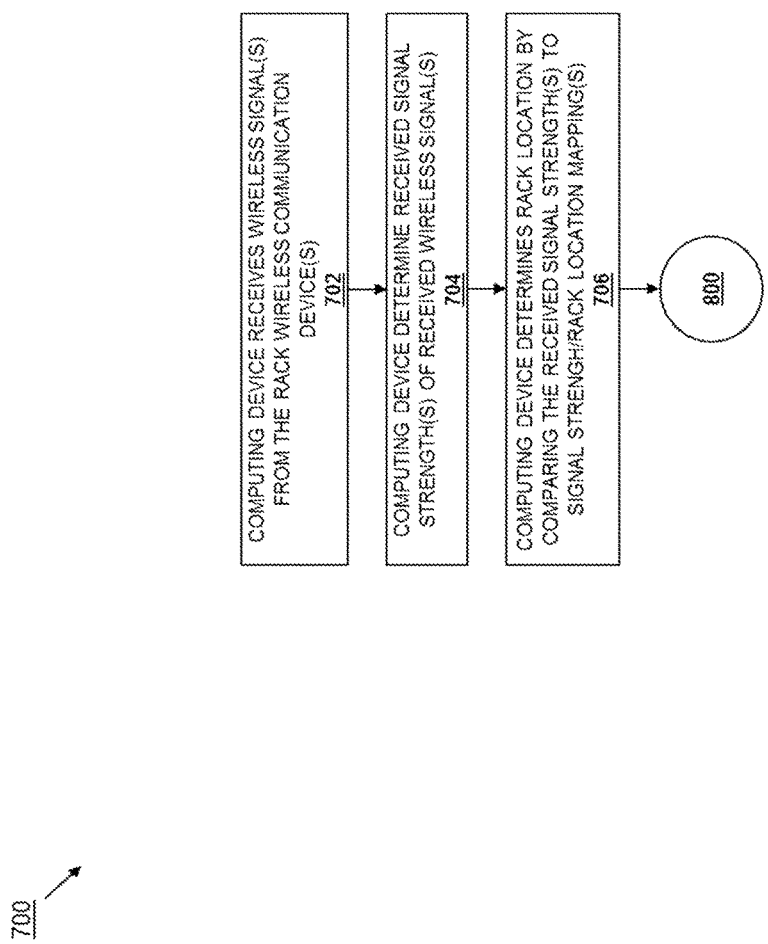
FIG. 7 is a flow chart illustrating an embodiment of a sub-method for determining rack locations of computing device that may be performed in the method of FIG. 5.
Figure 8:
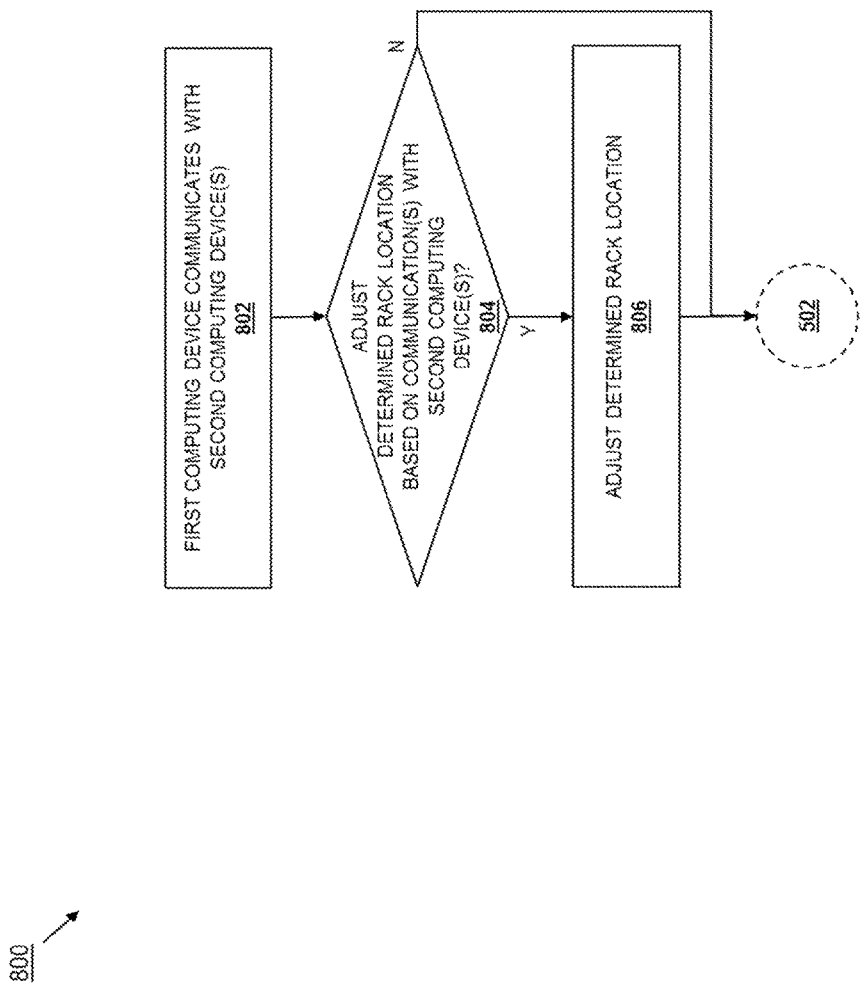
FIG. 8 is a flow chart illustrating an embodiment of a sub-method for adjusting determined rack locations of computing device that may be performed in the method of FIG. 5.

Referring now to FIG. 7, the sub-method 700 begins at block 702 where a computing device receives wireless signal(s) from rack wireless communication device(s). In an embodiment, the computing device may be positioned in a rack and may receive wireless signals from each respective rack wireless communication device included on or adjacent that rack. For example, to the rack 200 including the rack wireless communication devices 230 and 240 located on the top wall 202a and the bottom wall 202b (as illustrated in FIG. 9A) may house a plurality of server devices 400 that are each positioned in a respective device housing 210 of the rack 200. In the embodiments discussed below, the plurality of server devices 400 are substantially similar to each other. However, one of skill in the art in possession of the present disclosure will recognize that the plurality of server devices 400 may instead include different types of computing devices that may be used to perform any of a variety of computing functions known in the art. For the purposes of the discussion below, the functionality of a server device 400*a* is detailed herein. However, one of skill in the art in possession of the present disclosure will recognize that the other server devices 400 that are housed in the rack 200 may perform similar functions.

With reference to FIG. 9B, in an embodiment of block 702, the location determination engine 406 in the server device 400*a* receives a first wireless signal from the rack wireless communication device 230 through the wireless communication system 408 and antenna 404*a* of the server device 400*a* via a wireless communication 904, and a second wireless signal from the rack wireless communication device 240 through the wireless communication system 408 and antenna 404*a* of the server device 400*a* via a wireless communication 906. For example, the wireless signal engine 312 in each of the rack wireless communication devices 230 and 240 may generate and transmit a wireless signal using the wireless communication system 316 and antenna 330. Similarly as discussed above, the emitted wireless signal from each of the rack wireless communication devices 230 and 240 may include a power or signals strength according the signal strength/rack location mapping in that rack wireless communication device. In an embodiment, each wireless signal received from a respective rack wireless communication device may identify the rack wireless communication device from which it was received (e.g., via the UUID, Major function, Minor function, and/or other identifiers known in the art).

In an embodiment, the first wireless signal sent by the rack wireless communication device 230 and received by the server device 400*a* may include the wireless signal strength/rack location mapping 304 that is stored in the wireless signal database 314 of the rack wireless communication device 230, and the second wireless signal sent by the rack wireless communication device 240 and received by the server device 400*a* may include the wireless signal strength/rack location mapping 305 that is stored in the wireless signal database 314 of the rack wireless communication device 240. However, in other embodiments, the wireless signal strength/rack location mappings may be provided in the server device(s) by different devices and/or entities (e.g., the management device, an administrator, etc.) while remaining within the scope of the present disclosure. In some embodiments, the signal strength/rack location mappings (e.g., the mappings 304 and 305) received by the location determination engine 406 in the server device 400*a* may be stored in the location determination database 410 and in some cases combined to provide the signal strength/rack location mapping 430 as shown in FIG. 4C.

The sub-method 700 then proceeds to block 704 where the computing device determines signal strength(s) of the received wireless signal(s). In an embodiment, the server device 400*a* may determine a received signal strength for each wireless signal received from each rack wireless communication device. For example, the location determination engine 406 of the server device 400*a* may determine a first wireless signal strength (e.g., an RSSI) of the first wireless signal received from the rack wireless communication device 230 and a second wireless signal strength of the second wireless signal received from the rack wireless communication device 240. However, as discussed above, other wireless signal characteristics may be determined at block 704 while remaining within the scope of the present disclosure.

The sub-method 700 then proceeds to block 706 where the computing device determines a rack location by comparing the received signal strength(s) to wireless signal strength/rack location mapping(s). In an embodiment, the location determination engine 406 of the server device 400*a* may determine a rack location of the server device 400*a* in the rack 200 by comparing the first received signal strength of the first wireless signal received from the rack wireless communication device 230 to the wireless signal strength/rack location mapping 304. With reference to FIG. 4C, if the first received signal strength (e.g., the RSSI) of the first wireless signal is approximately 62-dB, then the location determination engine 406 of the server device 400*a* may use the signal strength/rack location mapping 304 to determine that the rack location of the server device 400*a* is approximately the 25U device housing (e.g., as 62-dBM on the signal strength/rack location mapping 304 corresponds approximately to the 25U device housing). In some embodiments, the location determination engine 406 in the server device may receive and average multiple wireless signals from the rack wireless communication device 230 for use with the signal strength/rack location mapping 304 to determine the rack location at block 706.

In the illustrated embodiment, the location determination engine 406 of the server device 400*a* may use more than one wireless signal from more than one rack wireless communication device, and more than one corresponding signal strength/rack location mapping to determine the rack location at block 706. For example, the location determination engine 406 of the server device 400*a* may also compare the second received signal strength of the second wireless signal received from the rack wireless communication device 240 to the wireless signal strength/rack location mapping 305. With reference again to FIG. 4C, if the second received signal strength (e.g. the RSSI) of the second wireless signal is approximately 70-dBm, then the location determination engine 406 of the server device 400*a* may use the signal strength/rack location mapping 305 to determine that the rack location of the server device 400*a* is approximately the 27U device housing (as 70-dBM on the signal strength/rack location mapping 305 corresponds approximately to the 27U device housing). In some embodiments, the location determination engine 406 of the server device 400*a* may then average the determined rack locations (e.g., the two device housings 25U and 27U) to estimate the rack location of the server device 400*a* (e.g., the 26U device housing based on the 25U and 27U device housings). In some embodiments, the location determination engine 406 of the server device 400*a* may then store the estimated rack location in the location determination database 410.

After the server device determines its rack location, the sub-method 700 may proceed to sub-method 800. The sub-method 800 is generally directed to computing device(s) adjusting the rack location determined in sub-method 700 through any of a variety of communications with other computing devices in the rack.

Figure 9C:
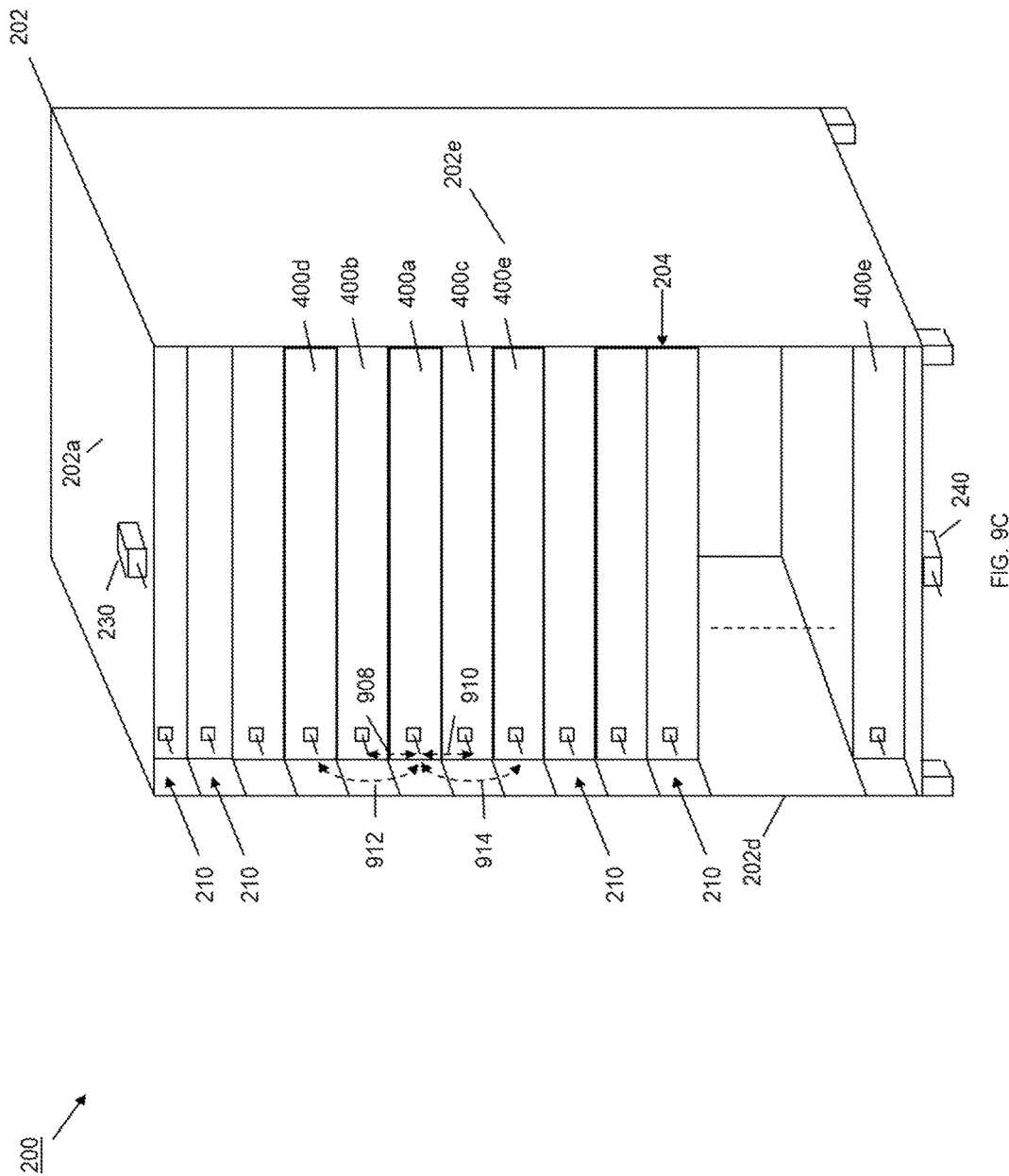
FIG. 9C is a perspective view illustrating an embodiment of communication between a plurality of the server devices of FIGS. 4A and 4B that are positioned in the rack of FIG. 2.

The sub-method 800 begins at block 802 where a first computing device communicates with a second computing device. Referring now to FIG. 9C, an embodiment of the server device 400*a* communicating with other servers devices 400*b*, 400*c*, 400*d*, and 400*e* that are housed in the rack 200 in adjacent device housings 210 is illustrated. However, the server device 400*a* may communicate at block 802 with any of the server devices 400 in the rack 200 and/or other rack devices in the rack 200 while remaining within the scope of the present disclosure. The communication between the server device 400a and the other server devices 400b-e in the rack 200 may include communicating a rack location determined and/or advertised by each server device, wireless signal strength/rack location mappings included in each server device, rack identification information included in each server device, wireless signals having predetermined signal strengths, and/or any other communication that would allow for the functionality discussed below. In the illustrated embodiment, the server device 400a may communicate with the server devices 400b, 400c, 400d, and 400e in the rack 200 via wireless communications 908, 910, 912, and 914, respectively.

The sub-method 800 then proceeds to decision block 804 where the first computing device determines whether to adjust its determined rack location based on the communication(s) with the second computing device(s). Continuing with the example above, the server device 400a may have determined its rack location (at block 706) as the 26U device housing in the rack 200 and stored the determined rack location (26U) in the location determination database 410 of the server device 400a. Similarly, the location determination engine 406 of the server device 400b may have determined its rack location as the 25U device housing in the rack 200 and stored the determined rack location (25U) in the location determination database 410 of the server device 400b. At block 804, the location determination engine 406 of the server device 400a may communicate with the location determination engine 406 of the server device 400b and receive a variety of rack location information such as, for example, the determined rack location of the server device 400b (25U), a wireless signal provided by the server device 400b, a signal strength/rack location mapping included in the server device 400b, etc. The location determination engine 406 of the server device 400b may then use the rack location (25U) determined by the server device 400b, the wireless signal from the server device 400b, the signal strength/rack location mapping used by the server device 400b, and/or other rack location information from the server device 400b to determine whether the server device 400a may need to adjust its determined rack location (27U). For example, the location determination engine 406 of the server device 400b may compare the wireless signal strength of the wireless signal received from the server device 400b to the wireless signal strength/rack location mapping received from the server device 400b and determine that, based on its determined rack location (26U) and the determined location of the server device 400b (27U) that it has correctly estimated its rack location and no adjustment to that determined rack location is necessary, and the sub-method 800 proceeds to block 502, discussed below.

However, with reference to FIG. 9C, assume that the server device 400a determined its rack location during the sub-method 700 to be the 26U device housing in the rack. However, at block 802, the server device 400a may receive a determined rack location from the server device 400b of 28U and a determined rack location from the server device 400c of 30U. In such an embodiment, the server device 400a may determine at decision block 804 that its rack location should be adjusted (i.e., because the 26U device housing in the rack 200 is not located between the 28U and 30U device housings in the rack 200). Such a determination may be further confirmed if the server device 400a receives a determined rack location from the server device 400d of 27U and a determined rack location from the server device 400e of 31U. As discussed above, the determination to adjust the rack location at decision block 804 may utilize other rack location information including the wireless signal strengths, mappings, and/or the other rack location information discussed above. For example, the signal strength of a wireless signal from the server device 400b may be determined to be stronger than a signal strength of a wireless signal from the server device 400d, thus providing confirmation that the 27U device housing and 28U device housing determinations are at least relatively accurate. At block 806 the computing device may adjust its determined location. Using the example provided above, at block 806, the location determination engine 406 in the server device 400a may change the determined rack location stored in the location determination database 410 (e.g., from the 26 device housing to the 29U device housing), and the sub-method 800 proceeds to block 502 of the method 500.

At block 502, the determined rack location(s) are provided in response to a request. For example, any of the management devices coupled to the server device 400a may provide a request for a device housing location of the server device 400a. In some embodiments, if the location determination engine 406 of the server device 400a has determined its rack location (e.g., the 26U or 29U device housing as discussed above), the location determination engine 406 in the server device 400a may report its determined rack location to the management device. In another embodiment, the reporting of the rack location by the server device 400a may provide other rack identification information. For example, the reported rack identification information may include a rack identifier, an aisle identifier, a room identifier, a datacenter identifier, and/or any other rack identification information that the server device 400a may have retrieved from the rack wireless communication device(s). In a specific example, each of the server devices 400 in the rack 200 may provide their determined rack locations to a remote management controller, which may then respond to requests by another management device (e.g., over a network) for rack locations of server devices in the rack 200.

Figure 10:
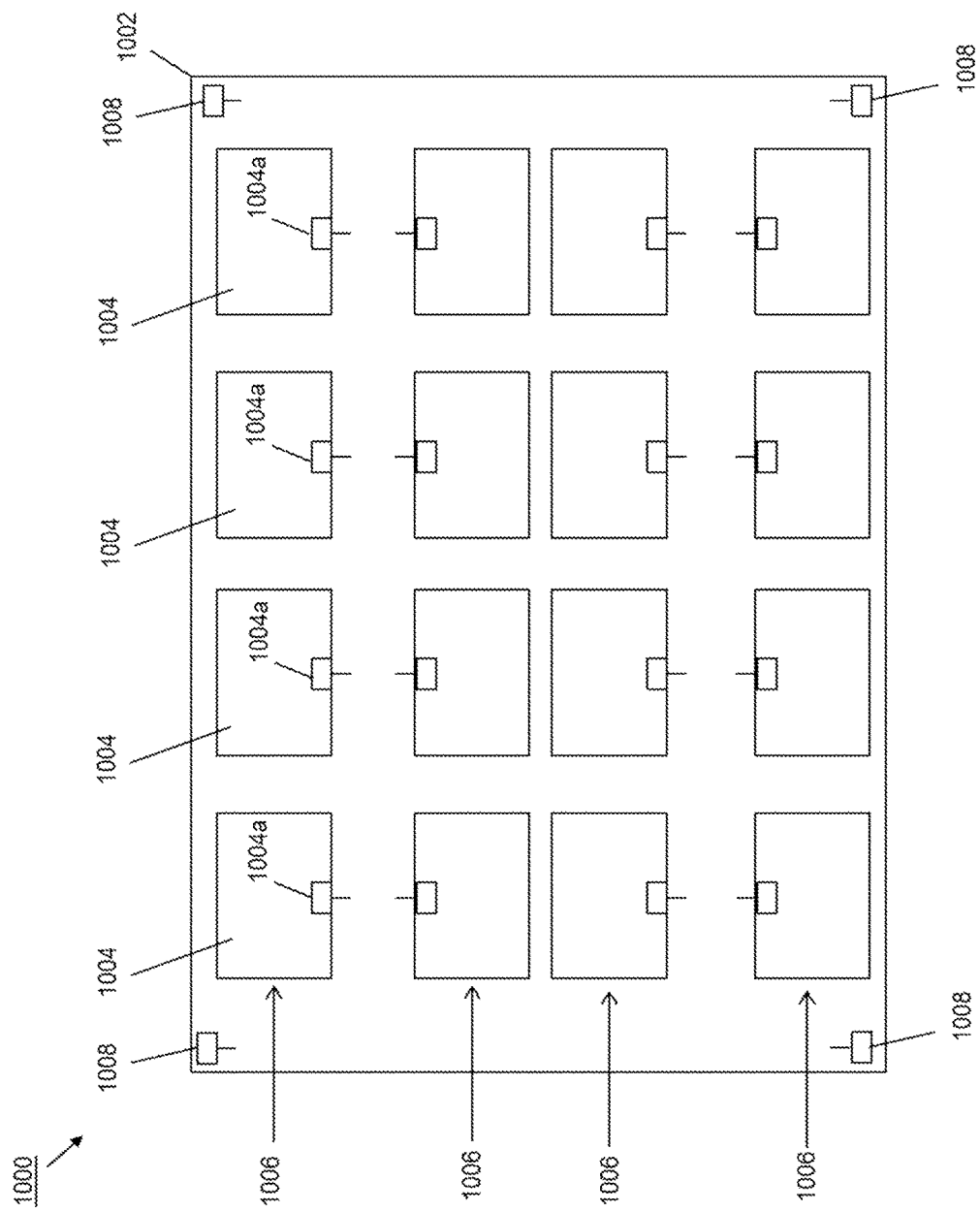
FIG. 10 is a schematic view illustrating an embodiment of a portion of a datacenter that includes a plurality of the racks of FIG. 2.

Referring now to FIG. 10, an embodiment of a portion of a datacenter 1000 is illustrated. The portion of the datacenter 1000 includes a room 1002 having a plurality of racks 1004 arranged in a plurality of aisles 1006. Any of the racks 1004 may be the rack 200 discussed above with reference to FIG. 2, and thus may include one or more rack wireless communication devices 1004a and rack devices (not illustrated) as discussed above. A plurality of wireless communication devices 1008 that may be substantially similarly in structure and/or function to the rack wireless communication devices discussed above may be positioned around the room. Similarly as discussed above to locate rack devices in any of the racks 1004, one of skill in the art in possession of the present disclosure will recognize how the rack wireless communication devices 1004a in different racks 1004 may communicate with the wireless communication devices 1008 and/or each other to determine relative rack locations in the aisles 1006, relative rack locations in the room 1008, and/or other rack location information. The ability to determine rack locations of rack devices in a rack, rack locations of racks in an aisle or a room, or even room locations in a datacenter using the techniques discussed above may enable the grouping of rack devices and/or racks and, in some cases, provide the ability to monitor those groupings based on their common (and specific) locations.

Thus, systems and methods have been described that provide for the determination of computing devices in a rack. The location determination taught by the present disclosure may be enabled by providing one or more rack wireless communication devices on the rack, and then enabling the computing devices in the rack to wirelessly communicate with those rack wireless communication devices. Thus, with relatively low hardware costs and little administrator effort, computing devices may automatically determine their locations in a rack, and provision that location to an administrator on demand. The systems and methods of the present disclosure provide for the calibration of rack location determinations by multiple components in the system to provide for increased accuracy of those rack location determinations, and provide substantial benefits over conventional systems and methods.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A rack location determination system, comprising:
   a rack that defines a plurality of device housings;
   a first rack wireless communication device that is positioned on the rack; and
   a first computing device that includes a first computing device wireless communication subsystem and that is positioned in a first device housing of the plurality of device housings in the rack, wherein the first computing device is configured to:
      receive a first wireless signal through the first computing device wireless communication subsystem from the first rack wireless communication device;
      determine a first wireless signal strength of the first wireless signal; and
      determine a first rack location of the first computing device by using the first wireless signal strength with a first wireless signal strength/rack location mapping that is associated with a location of the first rack wireless communication device.

2. The rack location determination system of claim 1, further comprising:
   a second rack wireless communication device that is positioned on the rack and located opposite the rack from the first rack wireless communication device.

3. The rack location determination system of claim 2, wherein the first computing device is configured to:
   receive a second wireless signal through the first computing device wireless communication subsystem from the second rack wireless communication device;
   determine a second wireless signal strength of the second wireless signal; and
   determine the first rack location of the first computing device by using the first wireless signal strength with the first wireless signal strength/rack location mapping, and by using the second wireless signal strength with a second wireless signal strength/rack location mapping that is associated with a location of the second rack wireless communication device.

4. The rack location determination system of claim 2, wherein the second rack wireless communication device is configured to:
   receive the first wireless signal strength/rack location mapping from the first rack wireless communication device;
   receive a second wireless signal from the first rack wireless communication device; and
   determine that a second wireless signal strength of the second wireless signal does not correspond to the first wireless signal strength/rack location mapping and, in response, send an instruction to the first rack wireless communication device to adjust the first wireless signal strength/rack location mapping.

5. The rack location determination system of claim 1, further comprising:
   a second computing device that includes a second computing device wireless communication subsystem and that is positioned in a second device housing of the plurality of device housings in the rack, wherein the first computing device is configured to:
      receive a second wireless signal through the first computing device wireless communication subsystem from the second computing device wireless communication subsystem on the second computing device;
      determine a second wireless signal strength of the second wireless signal; and
      adjust the first wireless signal strength/rack location mapping based on the second wireless signal strength.

6. The rack location determination system of claim 1, wherein the first computing device is configured to:
   receive a request for a device housing location from a management device and, in response, provide the first rack location to the management device.

7. An information handling system (IHS), comprising:
   a chassis that is configured to couple to a first device housing of a rack that defines a plurality of device housings;
   a chassis wireless communication system that is housed in the chassis;
   a processing system that is housed in the chassis and coupled to the chassis wireless communication system; and
   a memory system that is housed in the chassis, coupled to the processing system, and that includes instruction that, when executed by the processing system, cause the processing system to provide a rack location determination engine that is configured to:
      receive a first wireless signal through the chassis wireless communication system from a first rack wireless communication device that is positioned on the rack;
      determine a first wireless signal strength of the first wireless signal; and
      determine a first rack location of the chassis by using the first wireless signal strength with a first wireless signal strength/rack location mapping that is associated with a location of the first rack wireless communication device.

8. The IHS of claim 7, wherein the location determination engine is configured to:
   receive a second wireless signal through the chassis wireless communication system from a second rack wireless communication device;
   determine a second wireless signal strength of the second wireless signal; and
   determine the first rack location of the chassis by using the first wireless signal strength with the first wireless signal strength/rack location mapping, and by using the second wireless signal strength with a second wireless signal strength/rack location mapping that is associated with a location of the second rack wireless communication device.

9. The IHS of claim 8, wherein the location of the second rack wireless communication device is opposite the rack from the location of the first rack wireless communication device.

10. The IHS of claim 7, wherein the rack location determination engine is configured to:
  receive rack identification information through the chassis wireless communication system from the first rack wireless communication device; and
  providing the rack identification information to a management device.

11. The IHS of claim 10, wherein the rack identification information includes at least one of:
  a rack identifier, an aisle identifier, a room identifier, and a datacenter identifier.

12. The IHS of claim 7, wherein the rack location determination engine is configured to:
  receive a second wireless signal through the chassis wireless communication system from a computing device that is located in a second device housing of the rack;
  determine a second wireless signal strength of the second wireless signal; and
  adjust the first wireless signal strength/rack location mapping based on the second wireless signal strength.

13. The IHS of claim 7, wherein the rack location determination engine is configured to:
  receive a request for a device housing location from a management device and, in response, provide the first rack location to the management device.

14. A method for determining a rack location of a first computing device, comprising:
  receiving, by a first computing device that is located in a first device housing of a plurality of device housing that are defined by a rack, a first wireless signal from a first rack wireless communication device that is positioned on the rack;
  determining, by the first computing device, a first wireless signal strength of the first wireless signal; and
  determining, by the first computing device, a first rack location of the first computing device by using the first wireless signal strength with a first wireless signal strength/rack location mapping that is associated with a location of the first rack wireless communication device.

15. The method of claim 14, further comprising:
  receiving, by the first computing device, a second wireless signal from a second rack wireless communication device that is positioned on the rack and located opposite the rack from the first rack wireless communication device;
  determining, by the first computing device, a second wireless signal strength of the second wireless signal; and
  determining, by the first computing device, the first rack location of the first computing device by using the first wireless signal strength with the first wireless signal strength/rack location mapping, and by using the second wireless signal strength with a second wireless signal strength/rack location mapping that is associated with a location of the second rack wireless communication device.

16. The method of claim 15, further comprising:
  receiving, by the second rack wireless communication device, the first wireless signal strength/rack location mapping from the first rack wireless communication device;
  receiving, by the second rack wireless communication device, a third wireless signal from the first rack wireless communication device; and
  determining, by the second rack wireless communication device, that a third wireless signal strength of the third wireless signal does not correspond to the first wireless signal strength/rack location mapping and, in response, sending an instruction to the first rack wireless communication device to adjust the first wireless signal strength/rack location mapping.

17. The method of claim 14, further comprising:
  receiving, by the first computing device from the first rack wireless communication device, rack identification information; and
  providing, by the first computing device, the rack identification information to a management device.

18. The method of claim 17, wherein the rack identification information includes at least one of: a rack identifier, an aisle identifier, a room identifier, and a datacenter identifier.

19. The method of claim 14, further comprising:
  receiving, by the first computing device from a second computing device that is positioned in a second device housing of a plurality of device housing that are defined by the rack, a second wireless signal;
  determining, by the first computing device, a second wireless signal strength of the second wireless signal; and
  adjusting, by the first computing device, the first wireless signal strength/rack location mapping based on the second wireless signal strength.

20. The method of claim 14, further comprising:
  receiving, by the first computing device, a request for a device housing location from a management device and, in response, providing the first rack location to the management device.

* * * * *